(12) United States Patent
Ohashi et al.

(10) Patent No.: US 11,473,196 B2
(45) Date of Patent: Oct. 18, 2022

(54) SUBSTRATE PROCESSING APPARATUS

(71) Applicant: Kokusai Electric Corporation, Tokyo (JP)

(72) Inventors: Naofumi Ohashi, Toyama (JP); Tetsuaki Inada, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 17/012,875

(22) Filed: Sep. 4, 2020

(65) Prior Publication Data
US 2021/0301397 A1 Sep. 30, 2021

(30) Foreign Application Priority Data
Mar. 25, 2020 (JP) .............................. JP2020-054334

(51) Int. Cl.
*C23C 16/40* (2006.01)
*C23C 16/44* (2006.01)
(Continued)

(52) U.S. Cl.
CPC ........ *C23C 16/4408* (2013.01); *C23C 16/345* (2013.01); *C23C 16/4412* (2013.01);
(Continued)

(58) Field of Classification Search
CPC .............. C23C 16/345; C23C 16/4401; C23C 16/4408; C23C 16/4412; C23C 16/452;
(Continued)

(56) References Cited

U.S. PATENT DOCUMENTS 4,482,419 A * 11/1984 Tsukada ................... H01J 37/16
156/345.31
5,863,337 A * 1/1999 Neuman ................ C03C 17/002
118/718
(Continued)

FOREIGN PATENT DOCUMENTS

| JP | 2009-531549 A | 9/2009 |
|---|---|---|
| JP | 2010239102 A | 10/2010 |

(Continued)

OTHER PUBLICATIONS

Office Action in corresponding Taiwanese Patent Application No. 109130311, dated Sep. 15, 2021, with English translation.
(Continued)

*Primary Examiner* — Rudy Zervigon
(74) *Attorney, Agent, or Firm* — Edell, Shapiro & Finnan, LLC

(57) ABSTRACT

Described herein is a technique capable of suppressing generation of particles by removing by-products in a groove of a high aspect ratio. According to one aspect of the technique, there is provided a substrate processing apparatus including: a process chamber in which a substrate is processed; and a substrate support provided in the process chamber and including a plurality of supports where the substrate is placed, wherein the process chamber includes a process region where a process gas is supplied to the substrate and a purge region where the process gas above the substrate is purged, and the purge region includes a first pressure purge region to be purged at a first pressure and a second pressure purge region to be purged at a second pressure higher than the first pressure.

20 Claims, 10 Drawing Sheets

(51) Int. Cl.
*H01L 21/67* (2006.01)
*H01L 21/687* (2006.01)
*C23C 16/458* (2006.01)
*C23C 16/34* (2006.01)
*H01L 21/02* (2006.01)

(52) U.S. Cl.
CPC .... *C23C 16/4584* (2013.01); *H01L 21/67017* (2013.01); *H01L 21/68742* (2013.01); *H01L 21/68764* (2013.01); *H01L 21/68771* (2013.01); *H01L 21/0217* (2013.01); *H01L 21/02271* (2013.01)

(58) Field of Classification Search
CPC ........ C23C 16/45502; C23C 16/45519; C23C 16/45525; C23C 16/45527; C23C 16/45544; C23C 16/45551; C23C 16/45553; C23C 16/45557; C23C 16/45563; C23C 16/45574; C23C 16/45578; C23C 16/45587; C23C 16/45591; C23C 16/4584; C23C 16/505; C23C 16/509; C23C 16/5093; C23C 16/5096; C23C 16/45548; C23C 16/52; H01J 37/32082; H01J 37/32431; H01J 37/3244; H01J 37/32449; H01J 37/32568; H01J 37/32633; H01L 21/0217; H01L 21/02271; H01L 21/0228; H01L 21/02312; H01L 21/0262; H01L 21/67017; H01L 21/67109; H01L 21/68742; H01L 21/68764; H01L 21/68771; H01L 21/02057; H01L 21/67028; H01L 21/68714
USPC .................. 118/715; 156/345.33, 345.34
See application file for complete search history.

(56) References Cited

U.S. PATENT DOCUMENTS

| | | | | |
|---|---|---|---|---|
| 8,633,115 | B2* | 1/2014 | Chang | H01J 37/3244 438/715 |
| 9,837,254 | B2* | 12/2017 | Berry, III | H01J 37/32816 |
| 10,580,628 | B2* | 3/2020 | Berry, III | H01J 37/32816 |
| 2001/0009255 | A1* | 7/2001 | Savas | C23C 16/463 219/390 |
| 2004/0052972 | A1* | 3/2004 | Schmitt | C23C 16/4412 427/569 |
| 2004/0067641 | A1* | 4/2004 | Yudovsky | C23C 16/54 438/680 |
| 2004/0224433 | A1* | 11/2004 | Yamazaki | H01L 51/0022 438/39 |
| 2005/0001527 | A1* | 1/2005 | Sugiyama | H01J 37/32082 315/111.21 |
| 2006/0073276 | A1* | 4/2006 | Antonissen | C23C 16/45551 427/248.1 |
| 2006/0076512 | A1* | 4/2006 | Sohtome | H01J 37/3171 250/492.21 |
| 2007/0092650 | A1* | 4/2007 | Albrecht | G11B 5/743 427/282 |
| 2007/0215036 | A1* | 9/2007 | Park | C23C 16/45551 117/88 |
| 2007/0238311 | A1 | 10/2007 | Levy | |
| 2008/0096369 | A1* | 4/2008 | Strzyzewski | B05D 1/36 438/478 |
| 2009/0068849 | A1* | 3/2009 | Endo | C23C 16/4584 257/E21.24 |
| 2009/0078204 | A1* | 3/2009 | Kerr | H01L 21/67173 118/728 |
| 2009/0081366 | A1* | 3/2009 | Kerr | C23C 16/45551 427/255.28 |
| 2009/0081842 | A1* | 3/2009 | Nelson | C23C 16/45595 438/289 |
| 2009/0081885 | A1* | 3/2009 | Levy | C23C 16/45551 438/778 |
| 2009/0130858 | A1 | 5/2009 | Levy | |
| 2009/0136665 | A1* | 5/2009 | Choi | H01L 21/68792 427/255.7 |
| 2009/0217871 | A1* | 9/2009 | Kim | C23C 16/44 118/663 |
| 2010/0041213 | A1* | 2/2010 | Lee | H01L 21/4814 438/478 |
| 2010/0050943 | A1* | 3/2010 | Kato | C23C 16/401 118/730 |
| 2010/0055316 | A1* | 3/2010 | Honma | C23C 16/45551 427/255.28 |
| 2010/0055317 | A1* | 3/2010 | Kato | H01L 21/68771 427/255.28 |
| 2010/0175987 | A1* | 7/2010 | Creyghton | H05H 1/2406 204/164 |
| 2010/0226629 | A1* | 9/2010 | Basol | F27B 9/36 392/407 |
| 2011/0097492 | A1* | 4/2011 | Kerr | C23C 16/45574 427/248.1 |
| 2011/0097494 | A1* | 4/2011 | Kerr | C23C 16/458 427/255.5 |
| 2011/0139074 | A1* | 6/2011 | Kato | C23C 16/45578 118/730 |
| 2011/0212625 | A1* | 9/2011 | Toyoda | C23C 16/45565 438/758 |
| 2011/0214814 | A1* | 9/2011 | Iizuka | C23F 1/08 156/345.34 |
| 2012/0003396 | A1* | 1/2012 | Maas | C23C 16/45551 427/569 |
| 2012/0196050 | A1* | 8/2012 | Vermeer | C23C 16/50 427/535 |
| 2012/0208352 | A1* | 8/2012 | Kraus | C23C 16/303 438/478 |
| 2012/0222620 | A1* | 9/2012 | Yudovsky | C23C 16/458 118/725 |
| 2012/0225191 | A1* | 9/2012 | Yudovsky | C23C 16/45551 427/58 |
| 2012/0247390 | A1* | 10/2012 | Sawada | C23C 16/45502 118/723 AN |
| 2013/0012029 | A1* | 1/2013 | Vermeer | C23C 16/0245 438/758 |
| 2013/0043212 | A1* | 2/2013 | De Graaf | C23C 16/04 216/67 |
| 2013/0064977 | A1* | 3/2013 | Vermeer | C23C 16/545 427/255.5 |
| 2013/0118895 | A1* | 5/2013 | Roozeboom | C23C 16/0245 204/192.34 |
| 2013/0137267 | A1* | 5/2013 | Chang | H01J 37/3244 438/694 |
| 2013/0276983 | A1 | 10/2013 | Park et al. | |
| 2013/0312855 | A1* | 11/2013 | Birtcher | C23C 16/4481 137/544 |
| 2013/0323420 | A1* | 12/2013 | Knaapan | C23C 16/46 427/248.1 |
| 2014/0030445 | A1* | 1/2014 | Vermeer | F16C 32/0685 427/569 |
| 2014/0044887 | A1* | 2/2014 | Vermeer | C23C 16/45551 427/535 |
| 2014/0147587 | A1* | 5/2014 | Endo | B05D 1/005 427/240 |
| 2014/0179120 | A1* | 6/2014 | Ogawa | H01L 21/02189 438/782 |
| 2014/0179121 | A1* | 6/2014 | Ikegawa | H01L 21/02194 438/782 |
| 2015/0086715 | A1* | 3/2015 | Knaapen | C23C 16/45589 427/255.7 |
| 2015/0096495 | A1* | 4/2015 | Jeong | C23C 16/4412 118/729 |
| 2015/0140786 | A1* | 5/2015 | Kwak | H01J 37/32091 438/478 |
| 2015/0147889 | A1* | 5/2015 | Yudovsky | H01L 21/0228 438/758 |

(56) References Cited

U.S. PATENT DOCUMENTS

| | | | |
|---|---|---|---|
| 2015/0200110 A1* | 7/2015 | Li | H01J 37/3244 438/696 |
| 2015/0225848 A1* | 8/2015 | Han | C23C 16/45574 427/569 |
| 2015/0252474 A1 | 9/2015 | Itatani et al. | |
| 2015/0307988 A1* | 10/2015 | Saido | H01L 21/6776 438/758 |
| 2015/0361550 A1* | 12/2015 | Yabe | C23C 16/45551 438/782 |
| 2015/0368798 A1* | 12/2015 | Kwong | C23C 16/45578 118/729 |
| 2015/0376782 A1* | 12/2015 | Griffin | G01D 5/24 118/712 |
| 2015/0376785 A1* | 12/2015 | Knaapen | C23C 16/45544 427/557 |
| 2016/0049281 A1* | 2/2016 | Berry, III | C23F 4/00 118/723 R |
| 2016/0060759 A1* | 3/2016 | Kim | C23C 16/45519 239/296 |
| 2016/0068952 A1* | 3/2016 | Sasaki | C23C 16/4412 156/345.29 |
| 2016/0068953 A1* | 3/2016 | Li | C23C 16/4412 118/712 |
| 2016/0068958 A1* | 3/2016 | Kelkar | C23C 16/46 118/725 |
| 2016/0068961 A1* | 3/2016 | Liu | C23C 16/455 118/697 |
| 2016/0122873 A1* | 5/2016 | Iwasaki | C23C 16/45565 118/719 |
| 2016/0153086 A1* | 6/2016 | Kwak | H01J 37/32623 118/723 R |
| 2016/0217999 A1* | 7/2016 | Sato | C23C 16/403 |
| 2016/0227606 A1* | 8/2016 | Samir | F26B 3/30 |
| 2016/0260587 A1* | 9/2016 | Miura | H01L 21/31116 |
| 2016/0369398 A1* | 12/2016 | Yudovsky | C23C 16/45502 |
| 2017/0233868 A1 | 2/2017 | Donoso et al. | |
| 2017/0067156 A1* | 3/2017 | Leeser | H01J 37/32788 |
| 2017/0121820 A1* | 5/2017 | Chung | C23C 16/45563 |
| 2017/0137939 A1* | 5/2017 | Creyghton | H01J 37/32348 |
| 2017/0191158 A1* | 7/2017 | Poodt | C23C 16/45529 |
| 2017/0232457 A1 | 8/2017 | Fujino et al. | |
| 2017/0247794 A1* | 8/2017 | Mukae | C23C 28/42 |
| 2018/0002808 A1* | 1/2018 | Chung | H01L 21/02189 |
| 2018/0047548 A1* | 2/2018 | Berry, III | H01J 37/3244 |
| 2018/0254179 A1* | 9/2018 | Chan | C23C 16/345 |
| 2018/0265980 A1* | 9/2018 | Tutt | C23C 16/45578 |
| 2018/0275088 A1* | 9/2018 | Huff | C12Q 1/6869 |
| 2018/0279485 A1* | 9/2018 | Hillman | H01L 21/67109 |
| 2021/0301397 A1* | 9/2021 | Ohashi | C23C 16/45551 |

FOREIGN PATENT DOCUMENTS

| | | | | |
|---|---|---|---|---|
| JP | 2011-086912 A | | 4/2011 | |
| JP | 2013065791 A | | 4/2013 | |
| JP | 2015-078442 A | | 4/2015 | |
| JP | 2015181149 A | | 10/2015 | |
| JP | 2016-056410 A | | 4/2016 | |
| JP | 2017-034013 A | | 2/2017 | |
| JP | 2017-147262 A | | 8/2017 | |
| KR | 100949913 B1 | * | 3/2010 | ......... C23C 16/4408 |
| KR | 101021372 B1 | * | 3/2011 | ......... C23C 16/4412 |
| KR | 20110077743 A | * | 7/2011 | ........... C23C 16/455 |
| KR | 101171677 B1 | * | 8/2012 | ....... C23C 16/45525 |
| KR | 20130021755 A | * | 3/2013 | ........... C23C 16/458 |
| KR | 101301471 B1 | * | 9/2013 | ....... C23C 16/45551 |
| TW | 201707086 A | * | 2/2017 | ......... C23C 16/4404 |
| TW | 201707086 A | | 2/2017 | |

OTHER PUBLICATIONS

Office Action in corresponding Japanese Patent Application No. 2020-054334, dated Jan. 31, 2022, with English translation.

Office Action in corresponding Korean Patent Application No. 10-2020-0110837, dated Apr. 21, 2022, with English translation.

Office Action in corresponding Taiwan Patent Application No. 109130311, dated Apr. 18, 2022, with English translation.

* cited by examiner

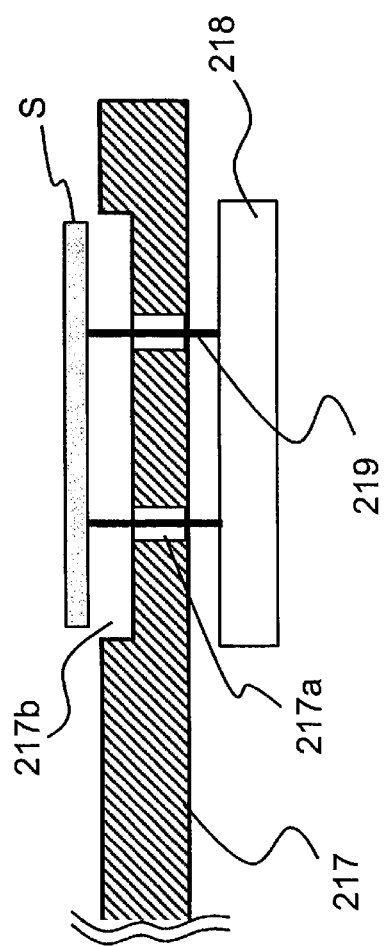

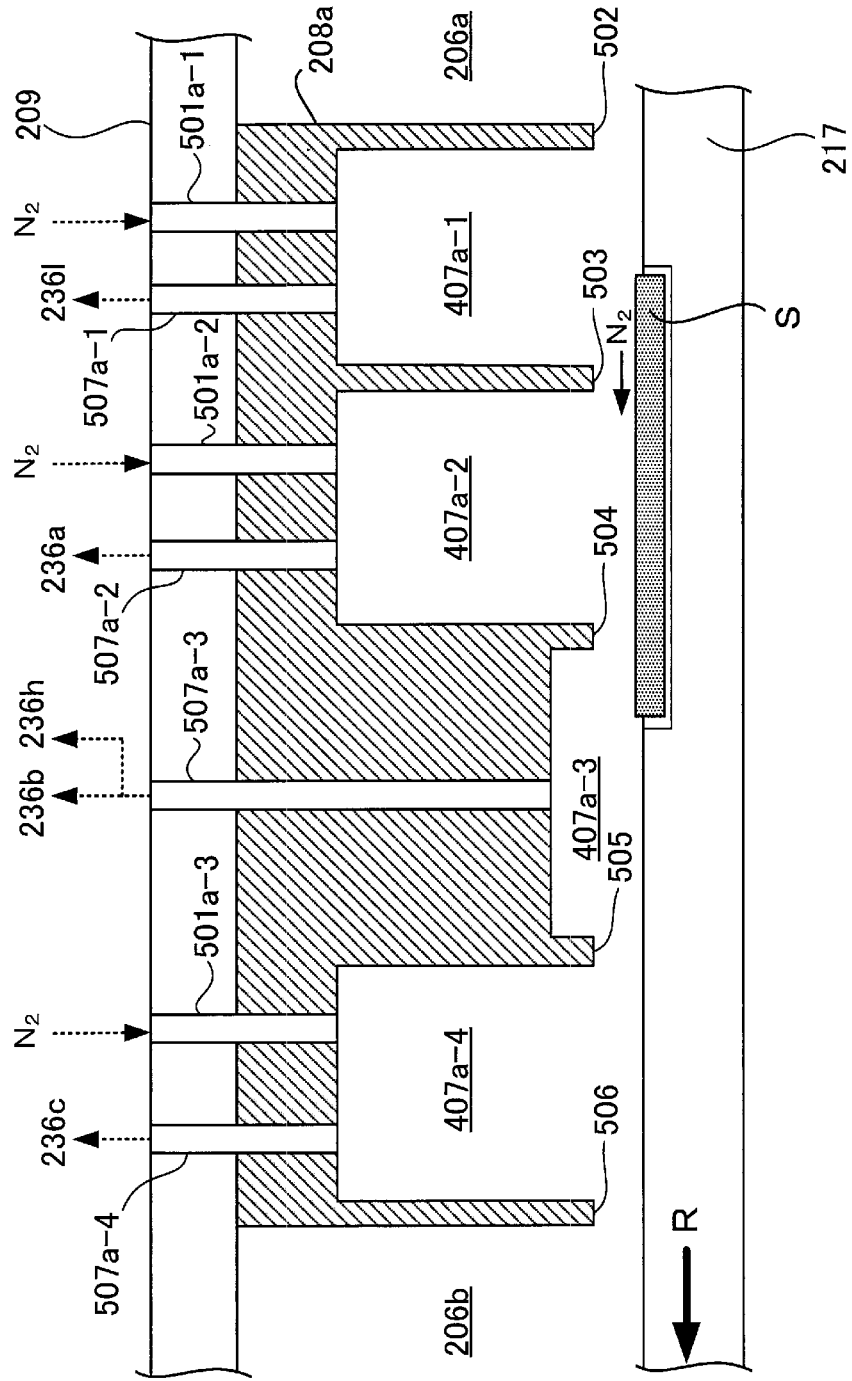

SUBSTRATE PROCESSING APPARATUS

CROSS REFERENCE TO RELATED APPLICATIONS

This application claims foreign priority under 35 U.S.C. § 119(a)-(d) to Application No. JP 2020-054334 filed on Mar. 25, 2020, the entire contents of which are hereby incorporated by reference.

TECHNICAL FIELD

The present disclosure relates to a substrate processing apparatus.

BACKGROUND

As an apparatus of processing a semiconductor substrate, a rotary type apparatus may be used. For example, according to the rotary type apparatus, a plurality of substrates are arranged on a substrate mounting table of the rotary type apparatus along a circumferential direction, and various gases are supplied onto the plurality of substrates by rotating the substrate mounting table. In addition, a vertical type apparatus may also be used. For example, according to the vertical type apparatus, a source gas is supplied onto a plurality of substrates stacked in the vertical type apparatus by using a source gas nozzle extending along a stacking direction of the plurality of the substrates stacked in the vertical type apparatus.

As a three-dimensional structure is used as a structure of a semiconductor device, a film-forming process with a good coverage has to be performed to a groove of a high aspect ratio. According to the rotary type apparatus, a process chamber is divided into a plurality of process regions, and each process of the film-forming process is performed in each process region. Therefore, by-products generated by a film-forming gas have to be removed from an inside of the groove.

SUMMARY

Described herein is a technique capable of suppressing generation of particles by removing by-products in a groove of a high aspect ratio.

According to one aspect of the technique of the present disclosure, there is provided a substrate processing apparatus including: a process chamber in which a substrate is processed; and a substrate support provided in the process chamber and including a plurality of supports where the substrate is placed, wherein the process chamber includes a process region where a process gas is supplied to the substrate and a purge region where the process gas above the substrate is purged, and the purge region includes a first pressure purge region to be purged at a first pressure and a second pressure purge region to be purged at a second pressure higher than the first pressure.

BRIEF DESCRIPTION OF THE DRAWINGS

FIG. 3 schematically illustrates a substrate support mechanism according to the embodiments described herein.

FIG. 10 schematically illustrates another modified example of a vertical cross-section taken along the line B-B' of the reactor of the substrate processing apparatus according to the embodiments shown in FIG. 1.

DETAILED DESCRIPTION

Hereinafter, one or more embodiments (also simply referred to as "embodiments") according to the technique of the present disclosure will be described with reference to the drawings.

(1) CONFIGURATION OF SUBSTRATE PROCESSING APPARATUS

Figure 1:
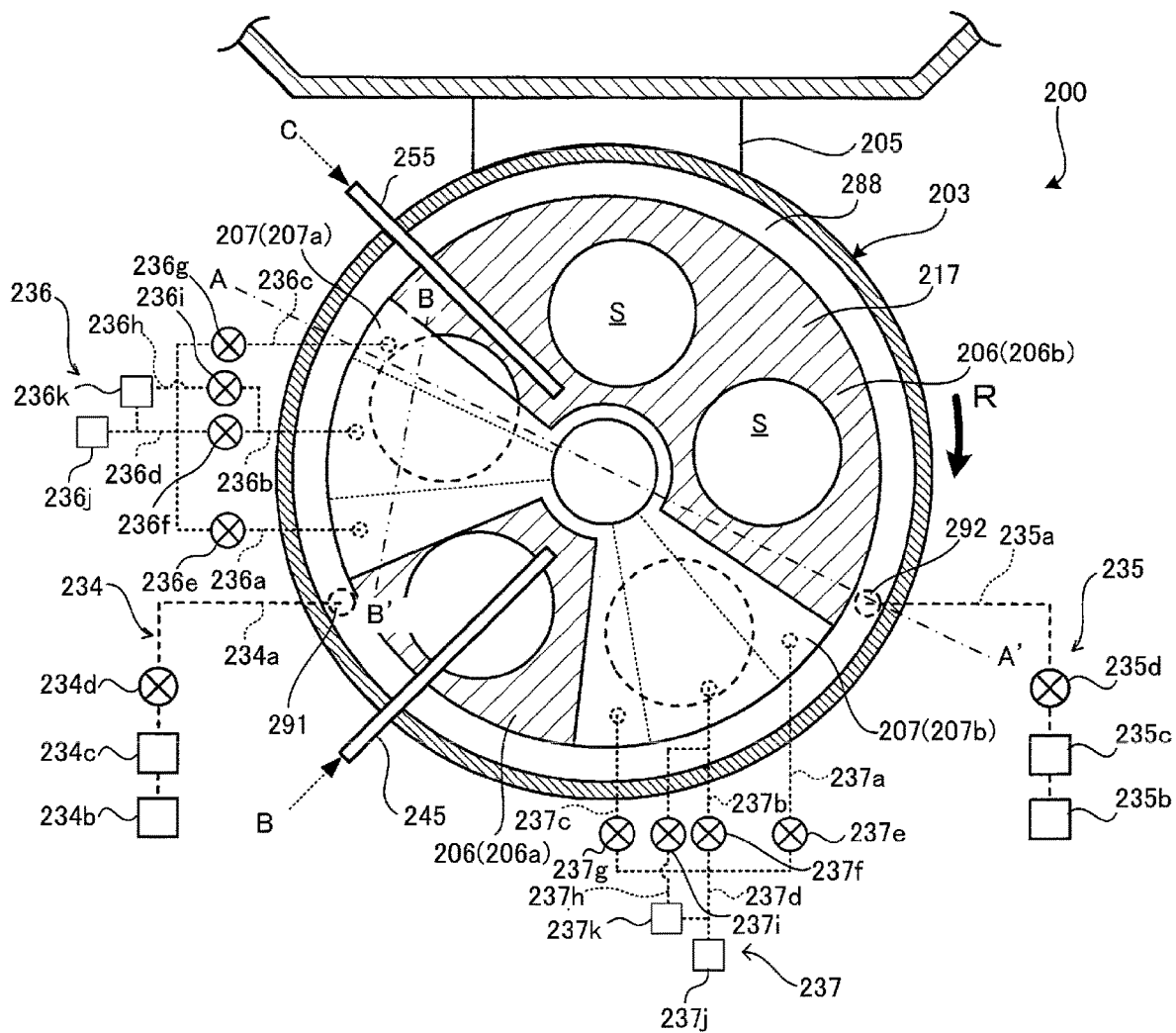
FIG. 1 schematically illustrates a horizontal cross-section of a reactor of a substrate processing apparatus according to one or more embodiment described herein.
Figure 2:
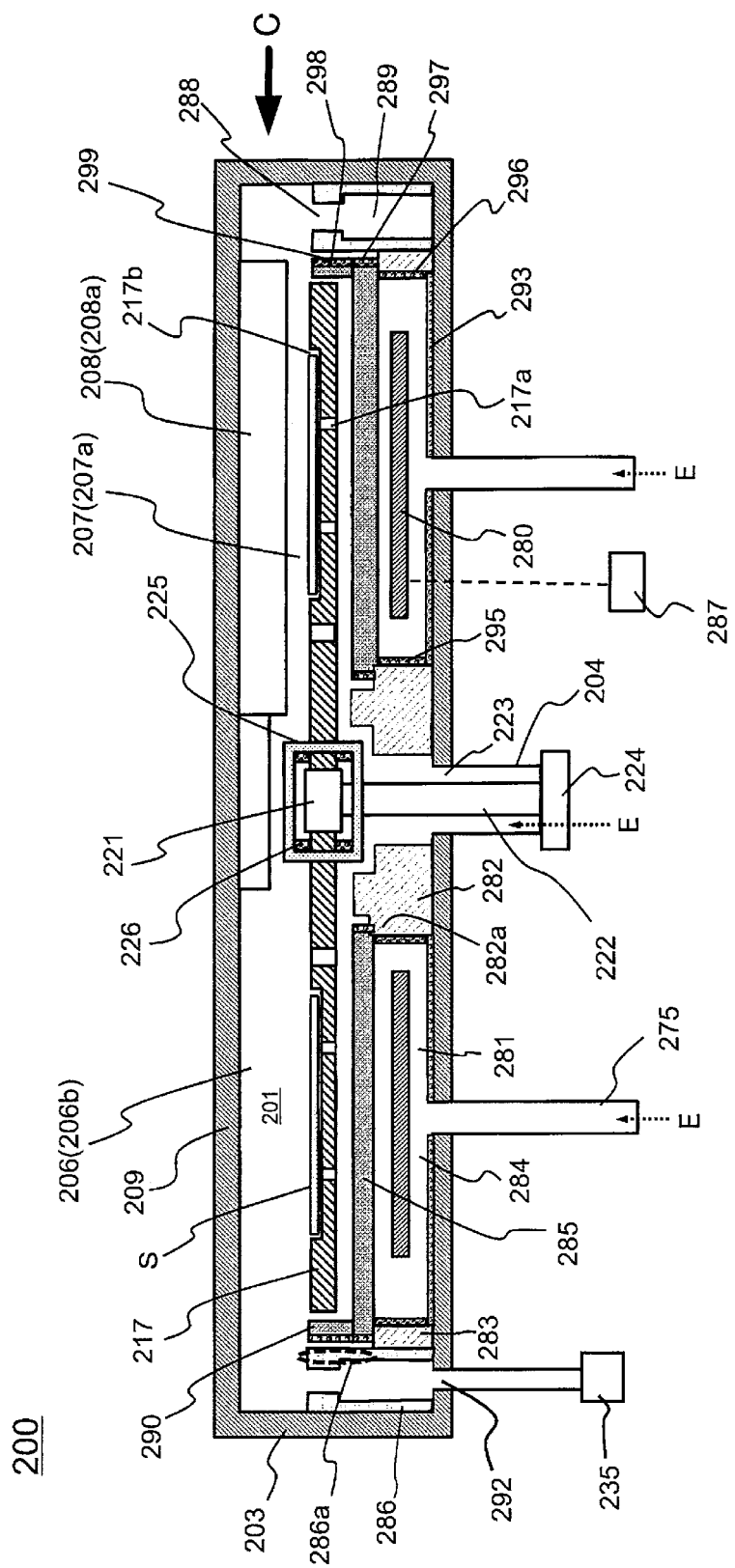
FIG. 2 schematically illustrates a vertical cross-section taken along the line A-A' of the reactor of the substrate processing apparatus according to the embodiments shown in FIG. 1.

As shown in FIGS. 1 and 2, a reactor 200 of a substrate processing apparatus (also referred to a "rotary type apparatus" or a "rotary type substrate processing apparatus") includes a process vessel 203 which is a cylindrical sealed vessel (hermetic vessel). For example, the process vessel 203 is made of a material such as stainless steel (SUS) and an aluminum alloy. A process chamber 201 in which a plurality of substrates (also simply referred to as "substrates") including a substrate S are processed is provided in the process vessel 203. A gate valve 205 is connected to the process vessel 203. The substrate S may be loaded (transferred) into or unloaded (transferred) out of the process vessel 203 through the gate valve 205.

The process chamber 201 includes a process region 206 to which a process gas such as a source gas and a reactive gas is supplied and a purge region 207 to which a purge gas is supplied. That is, the process gas is supplied to the substrate S in the process region 206, and the purge gas is supplied to the substrate S in the purge region 207. According to the embodiments, the process region 206 and the purge region 207 are alternately arranged along a circumferential direction of the process chamber 201. For example, a first process region 206a, a first purge region 207a, a second process region 206b and a second purge region 207b are arranged along the circumferential direction in this order. As described later, for example, the source gas is supplied into the first process region 206a, the reactive gas is supplied into the second process region 206b, and an inert gas serving as the purge gas is supplied into the first purge region 207a and the second purge region 207b. As a result, a predetermined processing (substrate processing) is performed to the substrate S in accordance with the gas supplied into each region.

The purge region 207a and the purge region 207b are configured to spatially separate the first process region 206a and the second process region 206b. As described later in detail, ceilings 208 of the purge region 207a and the purge region 207b are disposed lower than a ceiling of the process region 206 (that is, a lower surface of the top plate 209). Ceilings 208a and 208b are provided in the purge regions 207a and 207b, respectively, at positions facing a rotary table 217 serving as a substrate support. By purging spaces defined by the ceilings 208a and 208b and the rotary table 217, it is possible to remove excess gases on the substrate S. By purging spaces defined by the ceilings 208a and 208b and the rotary table 217, it is also possible to partition the adjacent process region 206 (that is, the first process region 206a and the second process region 206b).

The rotary table 217 configured to be rotatable is provided at a center portion of the process vessel 203. A rotating shaft of the rotary table 217 is provided at a center of the process vessel 203. For example, the rotary table 217 is made of a material such as quartz, carbon and silicon carbide (SiC) such that the substrate S is not affected by the metal contamination.

The rotary table 217 is configured such that the plurality of the substrates (for example, five substrates) including the substrate S can be arranged within the process vessel 203 on the same plane and along the same circumference along a rotational direction "R". In the present specification, the term "the same plane" is not limited to a perfectly identical plane but may also include a case where, for example, the plurality of the substrates including the substrate S are arranged so as not to overlap with each other when viewed from above.

A plurality of concave portions (also simply referred to as "concave portions") 217b serving as a part of substrate mounting table (that is, the rotary table 217) are provided on a surface of the rotary table 217 to support the plurality of the substrates including the substrate S. The concave portions 217b may also referred to as supports 217b. The number of the concave portions 217b is equal to the number of the substrates to be processed. For example, the plurality of the concave portions 217b are arranged at the same distance from a center of the rotary table 217, and are arranged along the same circumference at equal intervals (for example, 72° intervals). In FIG. 1, the illustration of the plurality of the concave portions 217b is omitted for simplification.

Each of the concave portions 217b is of a circular shape when viewed from above and of a concave shape when viewed by a vertical cross-section thereof. It is preferable that a diameter of each of the concave portions 217b is slightly greater than a diameter of the substrate S. A plurality of substrate placing surfaces are provided respectively at the bottoms of the plurality of the concave portions 217b, respectively. For example, the substrate S may be placed on the substrate placing surface by being placed on one of the concave portions 217b. Through-holes 217a penetrated by pins 219 described later are provided at each of the substrate placing surfaces of the concave portions 217b.

A substrate support mechanism 218 shown in FIG. 3 is provided in the process vessel 203 at a position below the rotary table 217 and facing the gate valve 205. The substrate support mechanism 218 includes the pins 219 configured to elevate or lower the substrate S and to support a back surface of the substrate S when the substrate S is loaded into or unloaded out of the process chamber 201. The pins 219 may be of an extendable configuration. For example, the pins 219 may be accommodated in a main body of the substrate support mechanism 218. When the substrate S is transferred, the pins 219 are extended and pass through the through-holes 217a. Thereby, the substrate S is supported by the pins 219. Thereafter, by moving front ends of the pins 219 downward, the substrate S is placed on one of the concave portions 217b. For example, the substrate support mechanism 218 is fixed to the process vessel 203. The substrate support mechanism 218 may be embodied by any configuration as long as the pins 219 can be inserted into the through-holes 217a when the substrate S is placed, and may also be fixed to an inner peripheral convex portion 282 or an outer peripheral convex portion 283 described later.

The rotary table 217 is fixed to a core portion 221. The core portion 221 is provided at the center of the rotary table 217 and configured to fix the rotary table 217. Since the core portion 221 supports the rotary table 217, for example, the core portion 221 is made of a metal that can withstand the weight of the rotary table 217. A shaft 222 is provided below the core portion 221. The shaft 222 supports the core portion 221.

A lower portion of the shaft 222 penetrates a hole 223 provided at a bottom of the process vessel 203, and a vessel 204 capable of hermetically sealing the shaft 222 covers a periphery of the lower portion of the shaft 222. The vessel 204 is provided outside the process vessel 203. A lower end of the shaft 222 is connected to a rotator (also referred to as a "rotating part" or a "rotating mechanism") 224. The rotator 224 is provided with components such as a rotating shaft (not shown) and a motor (not shown), and is configured to rotate the rotary table 217 according to an instruction from a controller 300 described later. That is, the controller 300 controls the rotator 224 to rotate the rotary table 217 about a point (for example, about the center of the core portion 221) provided outside the substrate S, so that the substrate S sequentially passes through the first process region 206a, the first purge region 207a, the second process region 206b and the second purge region 207b in this order.

A quartz cover 225 is provided so as to cover the core portion 221. That is, the quartz cover 225 is provided between the core portion 221 and the process chamber 201. The quartz cover 225 is configured to cover the core portion 221 via a space between the core portion 221 and the process chamber 201. For example, the quartz cover 225 is made of a material such as quartz and SiC such that the substrate S is not affected by the metal contamination. The core portion 221, the shaft 222, the rotator 224 and the quartz cover 225 may be collectively referred to as a "support".

A heater mechanism 281 is provided below the rotary table 217. A plurality of heaters including a heater 280 serving as a heating device are embedded in the heater mechanism 281. The plurality of heaters including the heater 280 are configured to heat the plurality of the substrate including the substrate S placed on the rotary table 217, respectively. The plurality of the heaters including the heater 280 are arranged along the same circumference in accordance with a shape of the process vessel 203.

The heater mechanism 281 is constituted mainly by: the inner peripheral convex portion 282 provided on the bottom of the process vessel 203 and on the center portion of the process vessel 203; the outer peripheral convex portion 283 disposed outside the heater 280; and the heater 280. The inner peripheral convex portion 282, the heater 280 and the outer peripheral convex portion 283 are arranged concentrically. A space 284 is provided between the inner peripheral convex portion 282 and the outer peripheral convex portion 283. The heater 280 is disposed in the space 284. Since the inner peripheral convex portion 282 and the outer peripheral convex portion 283 are fixed to the process vessel 203, the inner peripheral convex portion 282 and the outer peripheral convex portion 283 may be considered as a part of the process vessel 203.

While the embodiments will be described by way of an example in which the heater 280 of a circular shape is used, the embodiments are not limited thereto as long as the substrate S can be heated by the heater 280. For example, the heater 280 may be divided into a plurality of auxiliary heater structures. For example, the heater 280 may be embedded in the rotary table 217.

A flange 282a is provided at an upper portion of the inner peripheral convex portion 282 to face the heater 280. A window 285 is supported on upper surfaces of the flange 282a and the outer peripheral convex portion 283. For example, the window 285 is made of a material capable of transmitting the heat generated by the heater 280 such as quartz. The window 285 is fixed by interposing the window 285 between the inner peripheral convex portion 282 and an upper portion 286a of an exhaust structure 286 described later.

A heater temperature controller 287 is connected to the heater 280. The heater temperature controller 287 is electrically connected to the controller 300 described later, and is configured to control the supply of the electric power to the heater 280 according to an instruction from the controller 300 to perform a temperature control.

An inert gas supply pipe 275 communicating with the space 284 is provided at the bottom of the process vessel 203. The inert gas supply pipe 275 is connected to an inert gas supplier (which is an inert gas supply system) 270 described later. The inert gas supplied through the inert gas supplier 270 is supplied to the space 284 through the inert gas supply pipe 275. By setting the space 284 to an inert gas atmosphere, it is possible to prevent the process gas from entering the space 284 through a gap in the vicinity of the window 285.

The exhaust structure 286 made of a metal is disposed (provided) between an outer peripheral surface of the outer peripheral convex portion 283 and an inner peripheral surface of the process vessel 203. The exhaust structure 286 includes an exhaust groove 288 and an exhaust buffer space 289. Each of the exhaust groove 288 and the exhaust buffer space 289 is of a ring shape in accordance with the shape of the process vessel 203.

A portion of the exhaust structure 286 which is not in contact with the outer peripheral convex portion 283 is referred to as the upper portion 286a. As described above, the upper portion 286a is configured to fix the window 285 together with the inner peripheral convex portion 282.

According to the rotary type substrate processing apparatus as in the embodiments, it is preferable that a height of the substrate S is same as or close to a height of an exhaust port described later. When the height of the exhaust port is lower than that of the substrate S, a turbulent flow of the gas may occur at an end portion of the rotary table 217. On the other hand, it is possible to suppress the occurrence of the turbulent flow at an edge of the substrate S near the exhaust port by setting the height of the substrate S to be the same as or close to the height of an exhaust port.

According to the embodiments, an upper end of the exhaust structure 286 is provided at the same height as the rotary table 217. When the upper end of the exhaust structure 286 is provided at the same height as the rotary table 217, as shown in FIG. 2, a protrusion of the upper portion 286a protrudes from the window 285. To prevent the particles from diffusing, a quartz cover 290 is provided to cover the protrusion of the upper portion 286a. Without the quartz cover 290, the gas may come into contact with the upper portion 286a, corrode the upper portion 286a and generate the particles in the process chamber 201. A space 299 is provided between the quartz cover 290 and the upper portion 286a.

An exhaust port 291 and an exhaust port 292 are provided at a bottom of the exhaust structure 286. The exhaust port 291 and an exhaust port 292 serve as an exhauster (which is an exhaust mechanism). The source gas supplied into the first process region 206a is mainly exhausted through the exhaust port 291. The reactive gas supplied into the second process region 206b is mainly exhausted through the exhaust port 292. Each of the gases describe above is exhausted through the exhaust port 291 and the exhaust port 292 via the exhaust groove 288 and the exhaust buffer space 289.

Figure 4C:
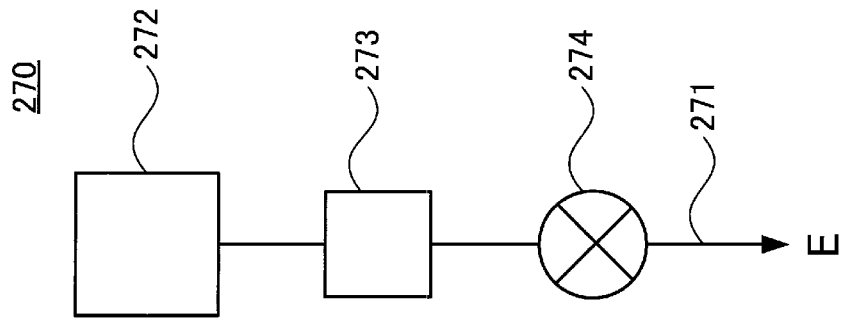
FIG. 4A schematically illustrates a source gas supplier according to the embodiments described herein, FIG. 4B schematically illustrates a reactive gas supplier according to the embodiments described herein, and FIG. 4C schematically illustrates an inert gas supplier according to the embodiments described herein.
Figure 4B:
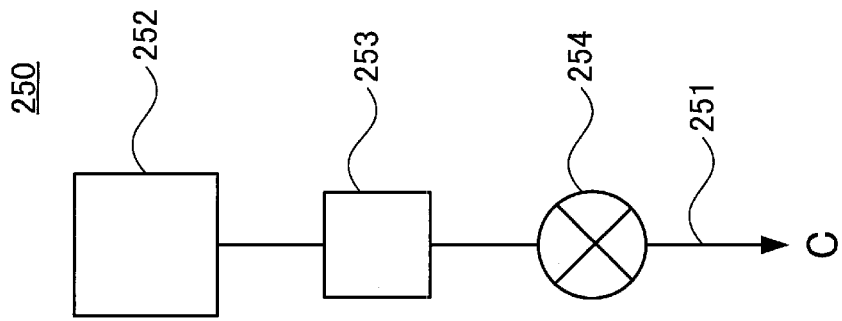
Figure 4A:
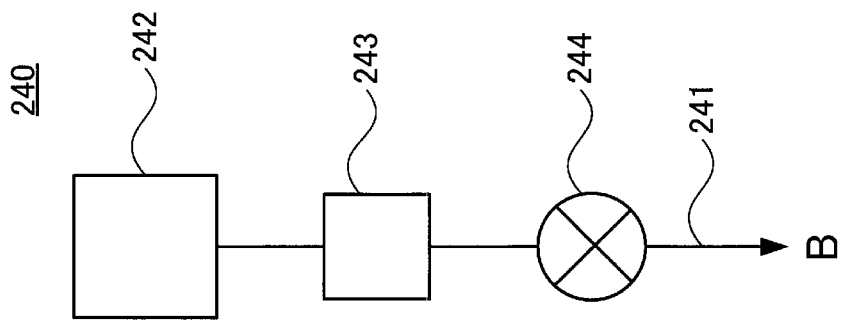

Subsequently, a source gas supplier (also referred to as a "source gas supply part" or a "source gas supply system") 240 will be described with reference to FIGS. 1 and 4A. As shown in FIG. 1, a nozzle 245 extending toward the center of the process vessel 203 penetrates a side of the process vessel 203. The nozzle 245 is provided in the first process region 206a. For example, a downstream end of a gas supply pipe 241 is connected to the nozzle 245.

A source gas supply source 242, a mass flow controller (MFC) 243 serving as a flow rate controller (also referred to as a "flow rate control mechanism") and a valve 244 serving as an opening/closing valve are provided at the gas supply pipe 241 in the sequential order from an upstream side to a downstream side of the gas supply pipe 241.

The source gas is supplied into the first process region 206a through the nozzle 245 via the gas supply pipe 241 provided with the MFC 243 and the valve 244.

In the present specification, the source gas is one of process gases, and serves as a source when a film is formed. The source gas contains at least one element constituting the film. For example, the source gas contains at least one element among silicon (Si), titanium (Ti), tantalum (Ta), hafnium (Hf), zirconium (Zr), ruthenium (Ru), nickel (Ni), tungsten (W) and molybdenum (Mo).

Specifically, according to the embodiments, for example, dichlorosilane ($Si_2H_2Cl_2$) gas may be used as the source gas. When a source of the source gas is a gaseous state under the normal temperature (room temperature), a gas mass flow controller is used as the MFC 243.

The source gas supplier (also referred to as a "first gas supply system" or a "first gas supply part") 240 is constituted mainly by the gas supply pipe 241, the MFC 243, the valve 244 and the nozzle 245. The source gas supplier 240 may further include the source gas supply source 242.

Subsequently, a reactive gas supplier (also referred to as a "reactive gas supply part" or a "reactive gas supply system") 250 will be described with reference to FIGS. 1 and 4B. As shown in FIG. 1, a nozzle 255 extending toward the center of the process vessel 203 penetrates a side of the process vessel 203. The nozzle 255 is provided in the second process region 206b.

A gas supply pipe 251 is connected to the nozzle 255. A reactive gas supply source 252, an MFC 253 and a valve 254 are provided at the gas supply pipe 251 in the sequential order from an upstream side to a downstream side of the gas supply pipe 251.

The reactive gas is supplied into the second process region 206b through the nozzle 255 via the gas supply pipe 251 provided with the MFC 253 and the valve 254.

In the present specification, the reactive gas is one of the process gases, and refers to a gas that reacts with a first layer formed on the substrate S by supplying the source gas. For example, the reactive gas may include at least one among ammonia ($NH_3$) gas, nitrogen ($N_2$) gas, hydrogen ($H_2$) gas and oxygen ($O_2$) gas. Specifically, according to the embodiments, for example, the $NH_3$ gas may be used as the reactive gas.

The reactive gas supplier (also referred to as a "second gas supply system" or a "second gas supply part") 250 is constituted mainly by the gas supply pipe 251, the MFC 253, the valve 254 and the nozzle 255. The reactive gas supplier 250 may further include the reactive gas supply source 252.

Subsequently, the inert gas supplier (which is an inert gas supply system) 270 will be described with reference to FIGS. 2 and 4C. A downstream end of an inert gas supply pipe 271 is connected to the inert gas supply pipe 275. An inert gas supply source 272, an MFC 273 and a valve 274 are provided at the inert gas supply pipe 271 in the sequential order from an upstream side to a downstream side of the inert gas supply pipe 271. The inert gas is supplied into the space 284 and the vessel 204 through the inert gas supply pipe 275 via the inert gas supply pipe 271 provided with the MFC 273 and the valve 274.

The inert gas supplied into the vessel 204 is exhausted through the exhaust groove 288 via a space between the rotary table 217 and the window 285. With such a structure, it is possible to prevent the source gas and the reactive gas from flowing into the space between the rotary table 217 and the window 285.

The inert gas supplier 270 is constituted mainly by the inert gas supply pipe 271, the MFC 273, the valve 274 and the inert gas supply pipe 275. The inert gas supplier 270 may further include the inert gas supply source 272.

In the present specification, the inert gas may include at least one among nitrogen ($N_2$) gas and a rare gas such as helium (He) gas, neon (Ne) gas and argon (Ar) gas. Specifically, according to the embodiments, for example, the $N_2$ gas may be used as the inert gas.

As shown in FIGS. 1 and 2, the exhaust port 291 and the exhaust port 292 are provided at the process vessel 203.

The exhaust port 291 is provided outside the rotary table 217 at a rotationally downstream side of the first process region 206a in the rotation direction "R". Thus, by exhausting (discharging) the source gas thermally decomposed and supplied to the substrate S through the first process region 206a, it is possible to suppress the influence of the thermally decomposed source gas on the substrate S. The source gas is mainly exhausted through the exhaust port 291. An exhaust pipe 234a which is a part of an exhauster (also referred to as an "exhaust system") 234 is provided so as to communicate with the exhaust port 291. A vacuum pump 234b serving as a vacuum exhaust device is connected to the exhaust pipe 234a via a valve 234d serving as an opening/closing valve and an APC (Automatic Pressure Controller) valve 234c serving as a pressure controller (also referred to as a "pressure regulator"). The vacuum pump 234b is configured to vacuum-exhaust an inner atmosphere of the process chamber 201 such that an inner pressure of the process chamber 201 reaches a predetermined pressure (vacuum degree).

The exhaust pipe 234a, the valve 234d and the APC valve 234c are collectively referred to as the exhauster 234. The exhauster 234 may further include the vacuum pump 234b.

As shown in FIGS. 1 and 2, an exhauster 235 is provided so as to communicate with the exhaust port 292. The exhaust port 292 is provided outside the rotary table 217 at a rotationally downstream side of the second process region 206b in the rotation direction "R". The reactive gas is mainly exhausted through the exhaust port 292.

An exhaust pipe 235a which is a part of the exhauster 235 is provided so as to communicate with the exhaust port 292. A vacuum pump 235b is connected to the exhaust pipe 235a via a valve 235d and an APC valve 235c. The vacuum pump 235b is configured to vacuum-exhaust the inner atmosphere of the process chamber 201 such that the inner pressure of the process chamber 201 reaches a predetermined pressure (vacuum degree).

The exhaust pipe 235a, the valve 235d and the APC valve 235c are collectively referred to as the exhauster 235. The exhauster 235 may further include the vacuum pump 235b.

Figure 5:
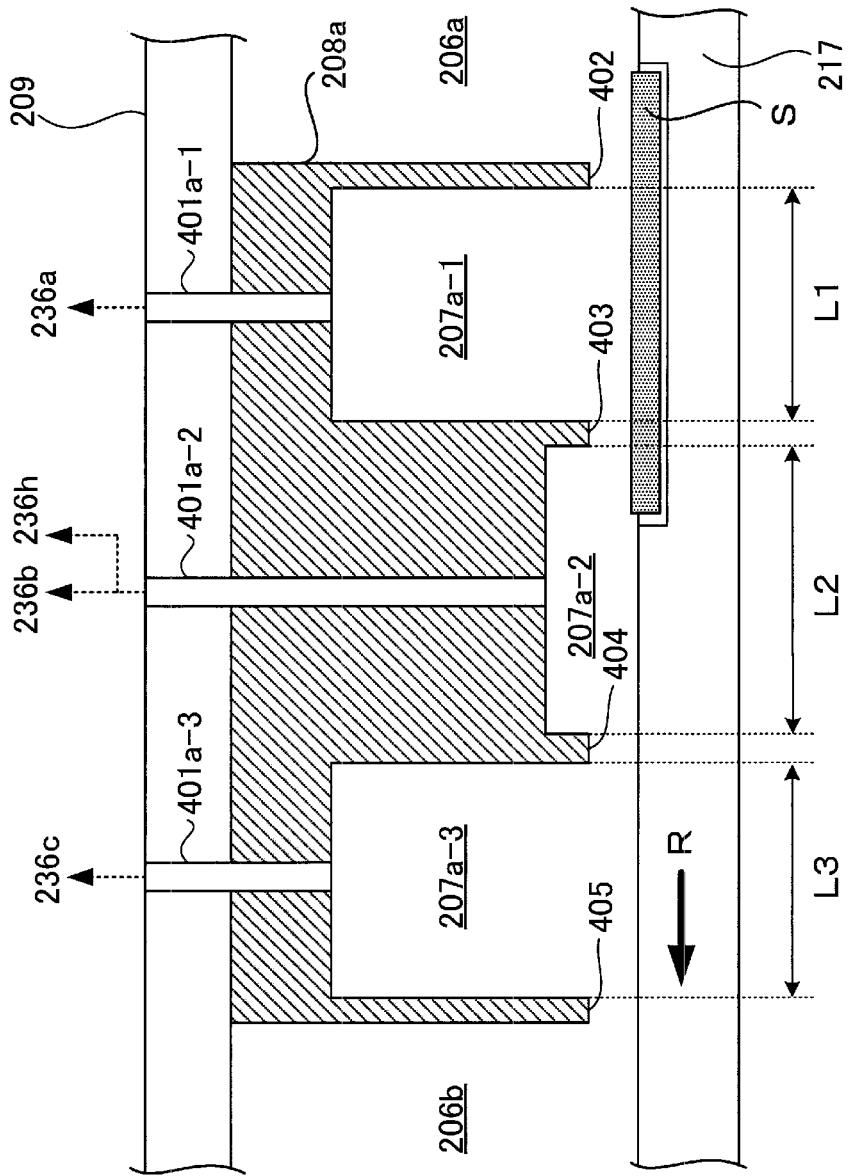
FIG. 5 schematically illustrates a vertical cross-section taken along the line B-B' of the reactor of the substrate processing apparatus according to the embodiments shown in FIG. 1.

Subsequently, the purge regions 207a and 207b will be described in detail with reference to FIGS. 1 and 5. Since a configuration of the purge region 207b is the same as that of the purge region 207a, only the purge region 207a will be described in detail and the description of the purge region 207b is omitted. FIG. 5 schematically illustrates a cross-section taken along the line B-B' of the reactor 200 of the substrate processing apparatus shown in FIG. 1. That is, FIG. 5 schematically illustrates the cross-section when viewed from the "C" direction shown in FIG. 2.

The purge region 207a is divided into three regions, that is, a first region 207a-1, a second region 207a-2 and a third region 207a-3 in this order, from a rotationally upstream side to a rotationally downstream side along the rotation direction "R" of the rotary table 217. The rotation direction "R" of the rotary table 217 is also referred to as a transfer direction of the substrate S. The first region 207a-1 is used as a first pressure purge region purged at a first pressure, the second region 207a-2 is used as a second pressure purge region purged at a second pressure, and the third region 207a-3 is used as a third pressure purge region purged at a third pressure. The first and third pressures are higher than the second pressure.

The ceiling 208a is provided at the purge region 207a so as to face the rotary table 217. A height of the ceiling 208a corresponding to the first region 207a-1, a height of the ceiling 208a corresponding to the second region 207a-2 and a height of the ceiling 208a corresponding to the third region 207a-3 are all different from one another. The ceiling 208a is connected to the lower surface of the top plate 209 of the process vessel 203 constituting the process chamber 201.

A partition 402 configured to separate the first process region 206a and the first region 207a-1 is provided between the first process region 206a and the first region 207a-1. A partition 403 configured to separate the first region 207a-1 and the second region 207a-2 is provided between the first region 207a-1 and the second region 207a-2. A partition 404 configured to separate the second region 207a-2 and the third region 207a-3 is provided between the second region 207a-2 and the third region 207a-3. A partition 405 configured to separate the third region 207a-3 and the second process region 206b is provided between the third region 207a-3 and the second process region 206b. Each of the partitions 402 through 405 serves as a part of the ceiling 208a. The partitions 402 through 405 are connected continuously with the ceiling 208a. Heights of the partitions 402 through 405 (that is, distances from un upper surface of the rotary table 217 to a lower end of each partition 402 through 405) are set such that the substrate S can be placed on one of the concave portions 217b by passing through a space defined by the rotary table 217 and the partitions 402 through 405. For example, the heights of the partitions 402 through 405 may range from 3 mm to 5 mm, respectively.

The height of the ceiling 208a corresponding to the first region 207a-1 (that is, the distance from the upper surface of the rotary table 217 to a lower surface of the ceiling 208a corresponding to the first region 207a-1) is lower than the height of the ceiling corresponding to the first process region 206a (that is, the distance from the upper surface of the rotary table 217 to the lower surface of the top plate 209). The height of the ceiling 208a corresponding to the second region 207a-2 is lower than the height of the ceiling corresponding to the first region 207a-1, and is equal to or higher than a lower end of the partition 403. In addition, the height of the ceiling 208a corresponding to the second region 207a-2 is lower than the height of the ceiling 208a corresponding to the third region 207a-3, and is equal to or higher than a lower end of the partition 404. The height of the ceiling 208a corresponding to the third region 207a-3 is higher than the height of the ceiling corresponding to the second process region 206b. According to the embodiments, for example, the height of the ceiling 208a corresponding to the first region 207a-1 is the same as the height of the ceiling 208a corresponding to the third region 207a-3.

Exhaust passages 401a-1, 401a-2 and 401a-3 communicating with the first region 207a-1, the second region 207a-2 and the third region 207a-3, respectively, are provided in the ceiling 208a and the top plate 209. The exhaust passages 401a-1, 401a-2 and 401a-3 are connected to exhaust pipes 236a, 236b and 236c, respectively. The exhaust pipes 236a, 236b and 236c are connected to an exhaust pipe 236d via valves 236e, 236f and 236g, respectively. The exhaust pipe 236d is connected to a vacuum pump 236j serving as a vacuum exhaust device. A branch passage 236h is connected to the exhaust pipe 236b at an upstream side of the valve 236f. The branch passage 236h is connected to the vacuum pump 236j via a valve 236i, an auxiliary pump 236k and the exhaust pipe 236d. For example, an air valve, an APC valve or both of the air valve and the APC valve may be used as the valves 236e, 236f, 236g and 236i. The first region 207a-1, the second region 207a-2 and the third region 207a-3 may be exhausted such that an inner pressure of each of the first region 207a-1, the second region 207a-2 and the third region 207a-3 reaches a predetermined pressure (vacuum degree).

For example, an inner diameter (also simply referred to as a "diameter") of the exhaust pipe 236b connected to the exhaust passage 401a-2 of the second region 207a-2 is greater than those of the exhaust pipes 236a and 236c. The exhaust pipes 236a and 236c are connected to the exhaust passage 401a-1 of the first region 207a-1 and the exhaust passage 401a-3 of the third region 207a-3, respectively.

That is, the gas in the first region 207a-1, the second region 207a-2 and the third region 207a-3 is exhausted through upper portions of the first region 207a-1, the second region 207a-2 and the third region 207a-3. In addition, the inner pressure of the second region 207a-2 is further reduced than those of the first region 207a-1 and the third region 207a-3 using the auxiliary pump 236k. As a result, the gas in the second region 207a-2 is exhausted while the vacuum degree of the second region 207a-2 is increased.

The exhaust pipes 236a through 236d, the valves 236e through 236g, the branch passage 236h and the valve 236i are collectively referred to as an exhauster (also referred to as an "exhaust system") 236. The exhauster 236 may further include the vacuum pump 236j and the auxiliary pump 236k.

Similarly, exhaust pipes 237a through 237d, valves 237e to 237g, branch passage 237h and a valve 237i connected to the respective regions in the purge region 207b are collectively referred to as an exhauster 237. The exhauster 237 may further include a vacuum pump 237j and an auxiliary pump 237k.

According to the embodiments, for example, by decreasing (lowering) the height of the ceiling 208a corresponding to the first region 207a-1 than the height of the ceiling 208a corresponding to the first process region 206a, the inner pressure of the first region 207a-1 is set lower than an inner pressure of the first process region 206a. By decreasing the height of the ceiling 208a corresponding to the second region 207a-2 than the height of the ceiling 208a corresponding to the first region 207a-1, the inner pressure of the second region 207a-2 is set lower than the inner pressure of the first region 207a-1. By increasing the height of the ceiling 208a corresponding to the third region 207a-3 than the height of the ceiling 208a corresponding to the second region 207a-2, the inner pressure of the third region 207a-3 is set higher than the inner pressure of the second region 207a-2. By increasing the height of the ceiling corresponding to the second process region 206b than the height of the ceiling 208a corresponding to the third region 207a-3, an inner pressure of the second process region 206b is set higher than the inner pressure of the third region 207a-3.

As described above, in the purge region 207a, the inner pressure of the first region 207a-1 is set lower than the inner pressure of the first process region 206a, the inner pressure of the second region 207a-2 is set lower than the inner pressure of the first region 207a-1 (that is, the vacuum degree of the second region 207a-2 is at a high vacuum state), and the inner pressure of the third region 207a-3 is set higher than the inner pressure of the second region 207a-2. By purging and vacuum-exhausting the first region 207a-1, the second region 207a-2 and the third region 207a-3 with the inner pressures set as described above, it is possible to alternately apply a pressure difference to the substrates S transferred in the purge region 207a. As a result, it is possible to remove the unreacted gas and by-products on the substrate S.

For example, a moving distance L2 of the substrate S in the second region 207a-2 is longer than a moving distance L1 of the substrate S in the first region 207a-1 and a moving distance L3 of the substrate S in third region 207a-3. By increasing (lengthening) the moving distance of the substrate S in the second region 207a-2 where the pressure is lower than other regions of the purge region 207a (that is, where the vacuum degree is higher than other regions of the purge region 207a), it is possible to more effectively remove the unreacted gas and by-products on the substrate S.

In addition, a purge gas supplier (also referred to as a "purge gas supply part" or a "purge gas supply system") (not shown) may be further provided in the first region 207a-1 and the third region 207a-3. The purge gas supplier is configured to supply the purge gas such as $N_2$ gas. The first region 207a-1 and the third region 207a-3 may be exhausted (vacuum-exhausted) while supplying the purge gas through the purge gas supplier.

In addition, the first region 207a-1 may not be provided. For example, the purge region 207a may be divided into two regions, that is, the second region 207a-2 and the third region 207a-3 in this order, from the rotationally upstream side to the rotationally downstream side along the rotation direction "R" of the rotary table 217 (also referred to as the transfer direction of the substrate S). The second region 207a-2 is used as the first pressure purge region to be purged at the first pressure, and the third region 207a-3 is used as the second pressure purge region to be purged at the second pressure higher than the first pressure.

Figure 6:
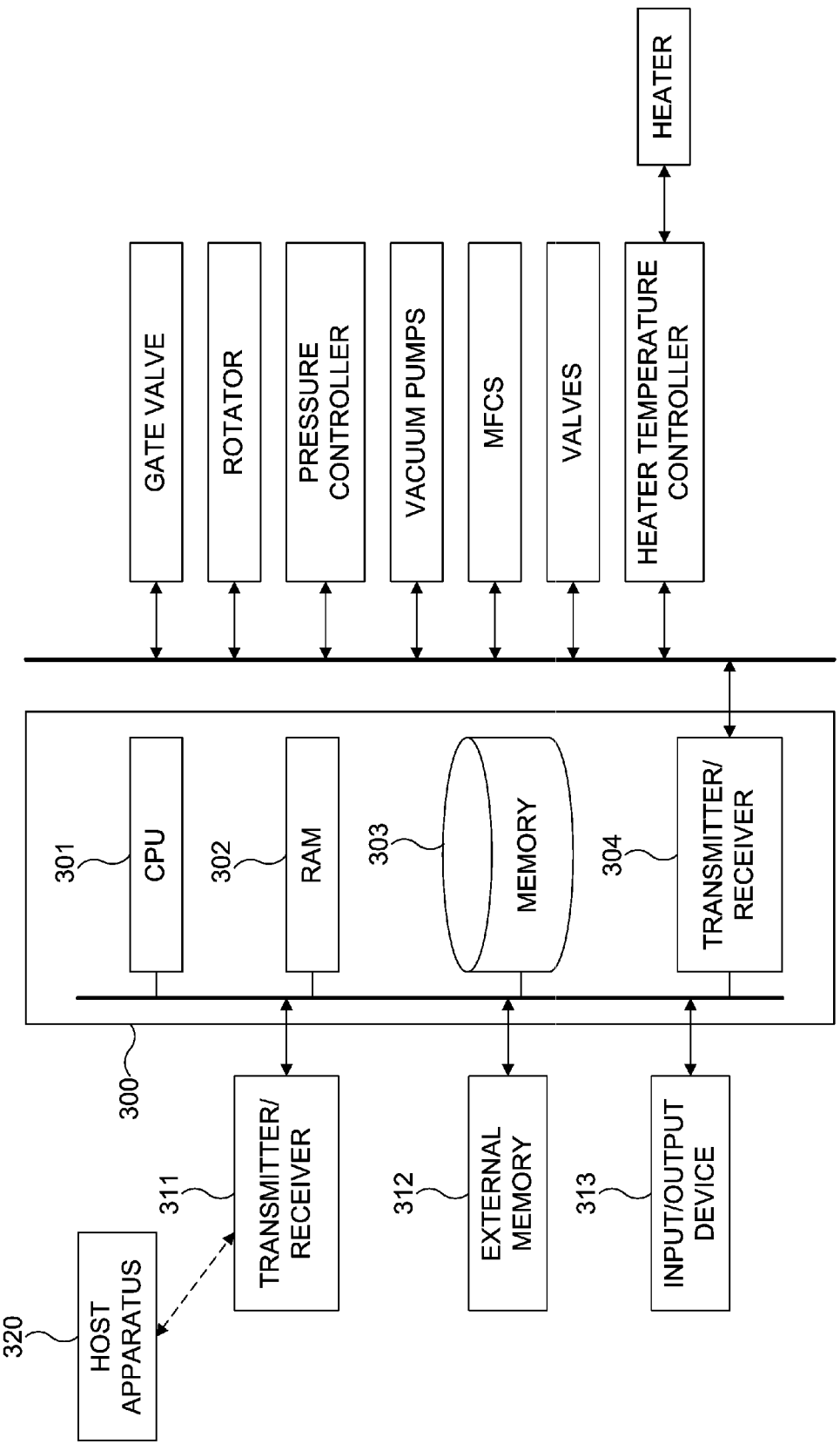
FIG. 6 is a block diagram schematically illustrating a configuration of a controller and related components of the substrate processing apparatus according to the embodiments described herein.

The reactor 200 includes the controller 300 configured to control the operations of the components of the substrate processing apparatus. As shown in FIG. 6, the controller 300 includes at least a CPU (Central Processing Unit) 301 serving as an arithmetic unit, a RAM (Random Access Memory) 302 serving as a temporary memory (also simply referred to as a "temporary memory device"), a memory (also simply referred to as a "memory device") 303 and a transmitter/receiver (also referred to as a "transmission/reception part") 304. The controller 300 is connected to the components of the substrate processing apparatus via the transmitter/receiver 304, calls a program or a recipe from the memory 303 in accordance with an instruction from a host controller or a user, and controls the operations of the components of the substrate processing apparatus according to the contents of the instruction. The controller 300 may be embodied by a dedicated computer or by a general-purpose computer. According to the embodiments, for example, the controller 300 may be embodied by preparing an external memory (also simply referred to as an "external memory device") 312 storing the program and by installing the program onto the general-purpose computer using the external memory 312. For example, the external memory 312 may include a magnetic tape, a magnetic disk such as a flexible disk and a hard disk, an optical disk such as a CD and a DVD, a magneto-optical disk such as an MO and a semiconductor memory such as a USB memory (USB flash drive) and a memory card. The means for providing the program to the computer is not limited to the external memory 312. For example, the program may be supplied to the computer (general-purpose computer) using communication means such as the Internet and a dedicated line. The program may be provided to the computer without using the external memory 312 by receiving the information (that is, the program) from a host apparatus 320 via a transmitter/receiver (also referred to as a "transmission/reception part") 311. In addition, a user can input an instruction to the controller 300 using an input/output device 313 such as a keyboard and a touch panel.

The memory 303 or the external memory 312 may be embodied by a non-transitory computer readable recording medium. Hereafter, the memory 303 and the external memory 312 may be collectively referred to as the recording medium. In the present specification, the term "recording medium" may refer to only the memory 303, may refer to only the external memory 312 or may refer to both of the memory 303 and the external memory 312.

The CPU 301 is configured to read a control program from the memory 303 and execute the read control program. Furthermore, the CPU 301 is configured to read the recipe such as a process recipe from the memory 303 according to an operation command inputted from the input/output device 313. According to the contents of the read recipe, the CPU 301 may be configured to control the operations of the components of the substrate processing apparatus.

(2) SUBSTRATE PROCESSING

Figure 7:
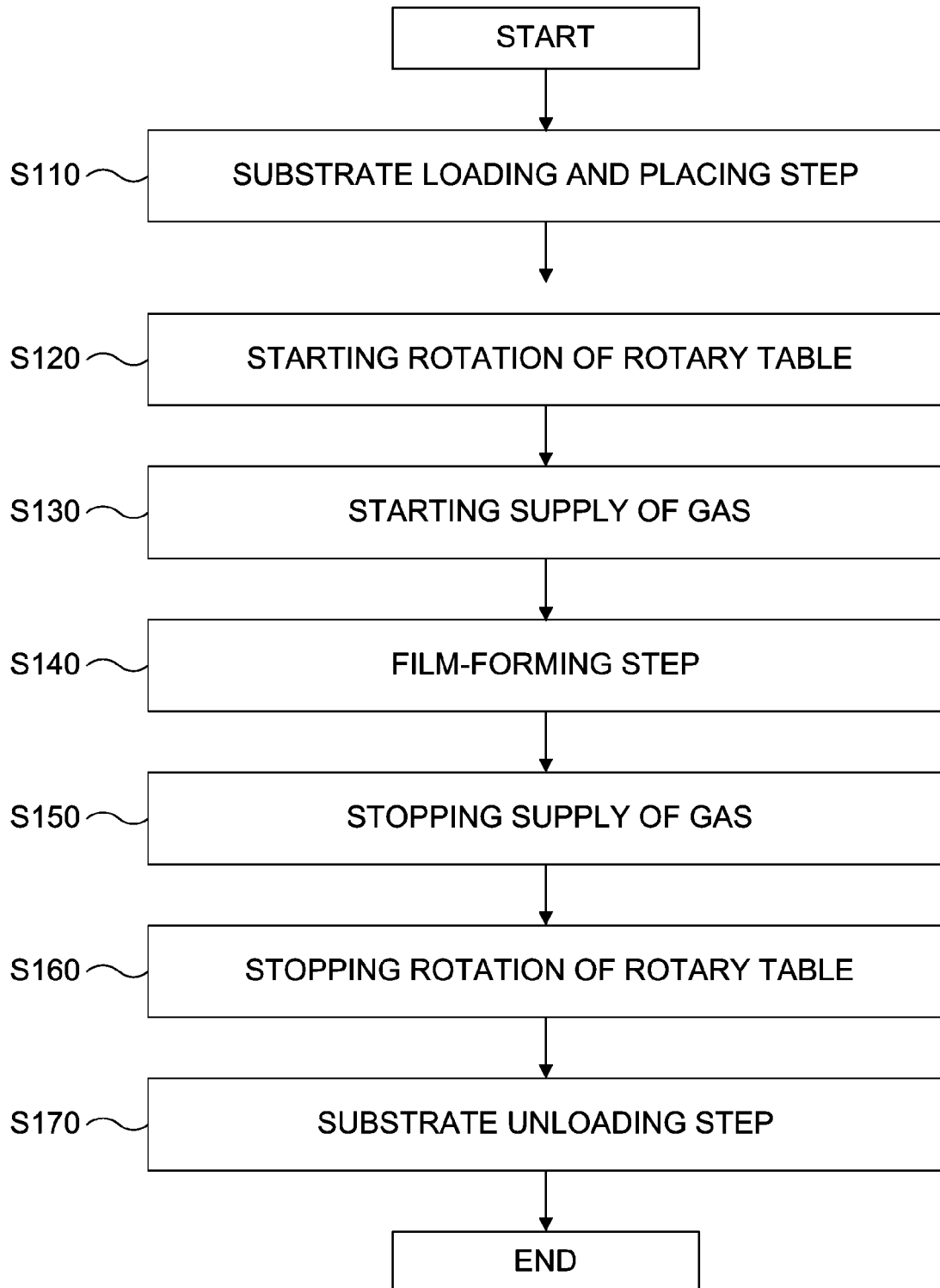
FIG. 7 is a flow chart schematically illustrating a substrate processing according to the embodiments described herein.
Figure 8:
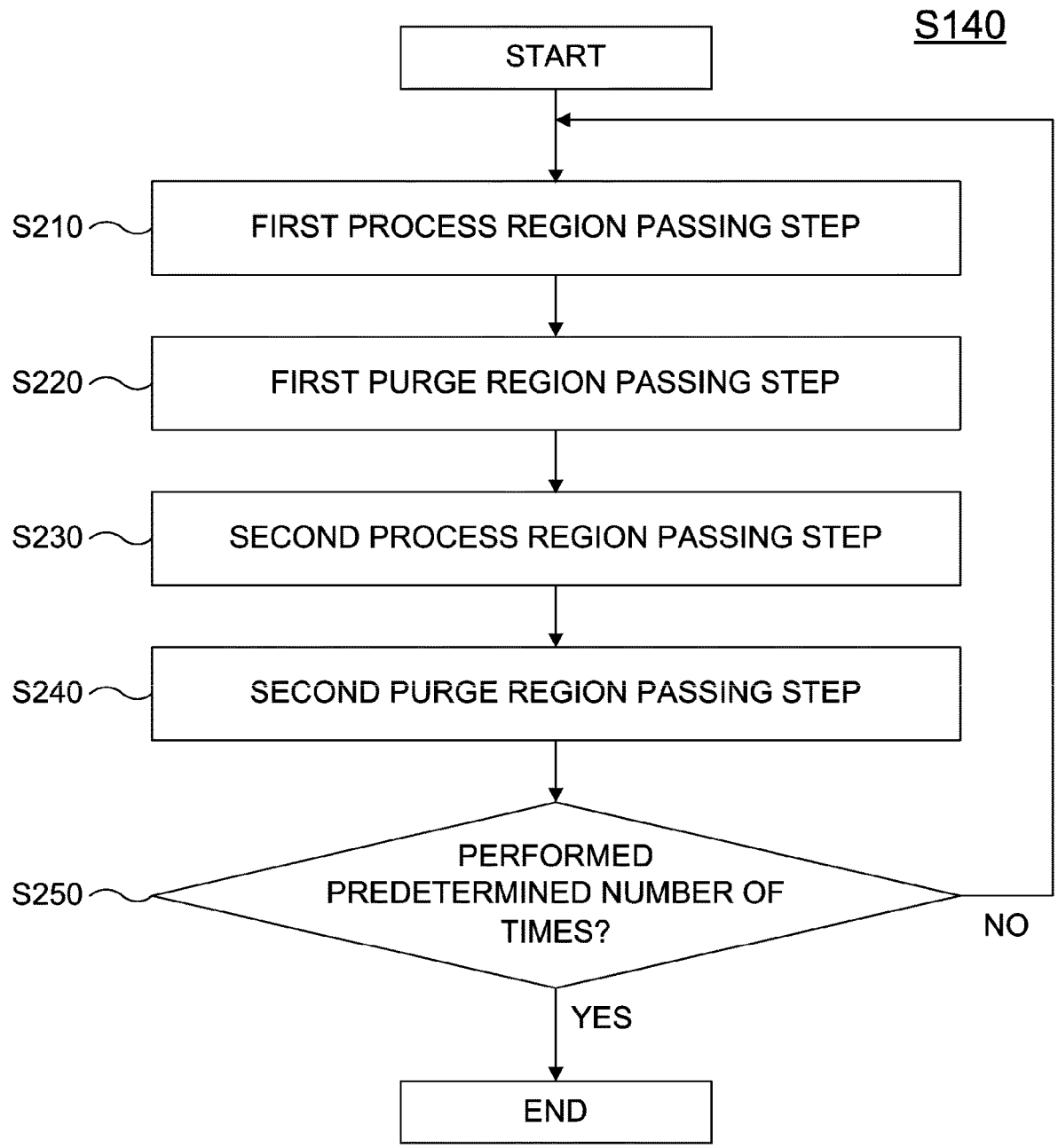
FIG. 8 is a flow chart schematically illustrating a film-forming step of the substrate processing according to the embodiments described herein.

Subsequently, the substrate processing according to the embodiments will be described with reference to FIGS. 7 and 8. FIG. 7 is a flow chart schematically illustrating the substrate processing according to the embodiments described herein. FIG. 8 is a flow chart schematically illustrating a film-forming step of the substrate processing according to the embodiments described herein. In the following description, the operations of the components of the substrate processing apparatus (and the reactor 200) are controlled by the controller 300.

The substrate processing according to the embodiments will be described by way of an example in which a silicon nitride (SiN) film serving as the film is formed on the substrate S by using the $Si_2H_2Cl_2$ gas as the source gas and the $NH_3$ gas as the reactive gas.

A substrate loading and placing step S110 will be described. In the reactor 200, the pins 219 are elevated such that the pins 219 pass through the through-holes 217a of the rotary table 217. As a result, the pins 219 protrude from the surface of the rotary table 217 by a predetermined height. Subsequently, the gate valve 205 is opened, and the substrate S is placed on the pins 219 as shown in FIG. 3 by using a substrate transfer device (not shown). After the substrate S is placed on the pins 219, by lowering the pins 219, the substrate S is placed on one of the concave portions 217b.

The rotary table 217 is rotated until one of the concave portions 217b, where the substrate S is not placed, faces the gate valve 205. Thereafter, one of the substrates is placed on the above-mentioned one of the concave portions 217b. An operation described above is repeated until the plurality of the substrates including the substrate S are placed on all of the concave portions 217b.

After the plurality of the substrates including the substrate S are placed on all of the concave portions 217b, the substrate transfer device is retracted out of the reactor 200, and the gate valve 205 is closed to seal the process vessel 203.

When the plurality of the substrates including the substrate S are loaded into the process chamber 201, it is preferable to purge the purge regions 207a and 207b while exhausting the process chamber 201 by the exhausters 234 and 235. Thereby, it is possible to suppress the particles from entering the process chamber 201 and from adhering onto the plurality of the substrates including the substrate S. The vacuum pumps 234b, 235b, 236j and 237j and the auxiliary pumps 236k and 237k may be continuously operated from the substrate loading and placing step S110 until at least a substrate unloading step S170 described later is completed.

When the substrate S is placed on the rotary table 217, the electric power is supplied to the heater 280 in advance such that a temperature (surface temperature) of the substrate S is adjusted to a predetermined temperature. For example, the predetermined temperature of the substrate S according to the embodiments may range from the room temperature to 650° C., preferably from the room temperature to 400° C. The electric power may be continuously supplied to the heater 280 from the substrate loading and placing step S110 until at least the substrate unloading step S170 described later is completed.

In the substrate loading and placing step S110, the inert gas is supplied to the process vessel 203 and the heater mechanism 281 through the inert gas supplier 270. The inert gas may be continuously supplied through the second inert gas supplier 270 from the substrate loading and placing step S110 until at least the substrate unloading step S170 described later is completed.

A step S120 of starting the rotation of the rotary table 217 will be described. After the plurality of the substrates including the substrate S are placed on all of the concave portions 217b, the controller 300 controls the rotator 224 to rotate the rotary table 217 in the "R" direction shown in FIG. 1. By rotating the rotary table 217, the substrate S is moved to the first process region 206a, the first purge region 207a, the second process region 206b and the second purge region 207b sequentially in this order.

A step S130 of starting the supply of the gas will be described. When the substrate S is heated to a desired temperature and the rotary table 217 reaches a desired rotation speed, the valve 244 is opened to start the supply of the $Si_2H_2Cl_2$ gas into the first process region 206a. In parallel with the supply of the $Si_2H_2Cl_2$ gas, the valve 254 is opened to supply the $NH_3$ gas into the second process region 206b.

In the step S130, a flow rate of the $Si_2H_2Cl_2$ gas is adjusted by the MFC 243 to a predetermined flow rate. For example, the predetermined flow rate of the $Si_2H_2Cl_2$ gas in the step S130 may range from 50 sccm to 500 sccm.

In the step S130, a flow rate of the $NH_3$ gas is adjusted by the MFC 253 to a predetermined flow rate. For example, the predetermined flow rate of the $NH_3$ gas in the step S130 may range from 100 sccm to 5,000 sccm.

In addition, after the substrate loading and placing step S110, the process chamber 201 is exhausted by the exhausters 234 and 235, and the first purge region 207a and the second purge region 207b are purged. In addition, by appropriately adjusting valve opening degrees of the APC valve 234c and the APC valve 235c, the inner pressure of the process chamber 201 is adjusted to a predetermined pressure.

A film-forming step S140 will be described. Here, a basic flow of the film-forming step S140 will be described, and the film-forming step S140 will be described in detail later. In the film-forming step S140, a silicon-containing layer is formed on the substrate S in the first process region 206a. After the substrate S is rotated to the second process region 206b, by reacting the silicon-containing layer with the $NH_3$ gas in the second process region 206b, a silicon nitride (SiN) film is formed on the substrate S. The rotary table 217 is rotated a predetermined number of times so that the SiN film of a desired thickness is obtained.

A step S150 of stopping the supply of the gas will be described. After the rotary table 217 is rotated the predetermined number of times, the valve 244 is closed to stop the supply of the $Si_2H_2Cl_2$ gas to the first process region 206a and the valve 254 is closed to stop the supply of the $NH_3$ gas to the second process region 206b.

A step S160 of stopping the rotation of the rotary table 217 will be described. After the supply of the $Si_2H_2Cl_2$ gas and the supply of the $NH_3$ gas are stopped according to the step S150, the rotation of the rotary table 217 is stopped in the step S160.

The substrate unloading step S170 will be described. The rotary table 217 is rotated to move the substrate S to the position facing the gate valve 205. Thereafter, the substrate S is supported on the pins 219 in the same manner as when the substrate S is loaded. After the substrate S is supported on the pins 219, the gate valve 205 is opened, and the substrate S is unloaded (transferred) out of the process vessel 203 using the substrate transfer device (not shown). An operation described above is repeated until all of the plurality of the substrates are unloaded out of the process vessel 203. After all of the plurality of the substrates are unloaded, the supply of the inert gas by the inert gas supplier 270 is stopped.

Subsequently, the film-forming step S140 will be described in detail with reference to FIG. 8. The film-forming step S140 will be mainly described based on the substrate S among the plurality of the substrates placed on the rotary table 217 from a first process region passing step S210 to a second purge region passing step S240.

As shown in FIG. 8, during the film-forming step S140, the plurality of the substrates including the substrate S pass through the first process region 206a, the first purge region 207a, the second process region 206b and the second purge region 207b sequentially in this order as the rotary table 217 is rotated.

The first process region passing step S210 will be described. As the substrate S passes through the first process region 206a, the $Si_2H_2Cl_2$ gas is supplied to the substrate S. When the substrate S passes through the first process region 206a, since there is no reactive gas in the first process region 206a, the $Si_2H_2Cl_2$ gas directly contacts (adheres) to the surface of the substrate S without reacting with the reactive gas. Thereby, the first layer is formed on the surface of the substrate S.

Subsequently, a first purge region passing step S220 will be described. After passing through the first process region 206a, the substrate S moves to the first region 207a-1 of the purge region 207a. By vacuum-exhausting the first region 207a-1 at a pressure lower than that of the first process region 206a, components of the $Si_2H_2Cl_2$ gas which are not strongly adhered to the substrate S in the first process region 206a are removed from the substrate S.

Then, after passing through the first region 207a-1, the substrate S moves to the second region 207a-2. By vacuum-exhausting the second region 207a-2 at a pressure lower than that of the first region 207a-1, the by-products which are adhered onto the substrate S and are not completely removed from the first region 207a-1 are removed from the substrate S.

Then, after passing through the second region 207a-2, the substrate S moves to the third region 207a-3. By vacuum-exhausting the third region 207a-3 at a pressure higher than that of the second region 207a-2, the by-products which are adhered onto the substrate S and are not completely removed from the second region 207a-2 are removed from the substrate S.

That is, in the purge region 207a, by transferring the substrate S through a plurality of regions of different pressures (different vacuum degrees), it is possible to remove the by-products in a groove of a high aspect ratio, and to suppress the generation of the particles.

A second process region passing step S230 will be described. After passing through the first purge region 207a, the substrate S moves to the second process region 206b. When the substrate S passes through the second process region 206b, the first layer reacts with the $NH_3$ gas serving as the reactive gas in the second process region 206b. Thereby, a second layer containing at least silicon (Si) and nitrogen (N) is formed on the substrate S.

Subsequently, the second purge region passing step S240 will be described. After passing through the second process region 206b, similar to the first purge region passing step S220, the substrate S passes through a first region, a second region and a third region of the purge region 207b. That is, the substrate S passes through a plurality of regions of different pressures (different vacuum degrees) in the purge region 207b. When the substrate S passes through each region of the purge region 207b, substances such as HCl desorbed from the second layer on the substrate S in the second process region 206b and surplus $H_2$ gas are removed from the substrate S.

As described above, at least two gases reacting with each other are sequentially supplied to the substrate S. A cycle of the embodiments includes the first process region passing step S210, the first purge region passing step S220, the second process region passing step S230 and the second purge region passing step S240.

A determination step S250 will be described. In the determination step S250, the controller 300 determines whether the cycle including the first process region passing step S210, the first purge region passing step S220, the second process region passing step S230 and the second purge region passing step S240 has been performed a predetermined number of times. Specifically, the controller 300 counts the number of the rotation of the rotary table 217.

When the cycle has not been performed the predetermined number of times ("NO" in the step S250 of FIG. 8), the rotary table 217 is rotated and the cycle including the first process region passing step S210, the first purge region passing step S220, the second process region passing step S230 and the second purge region passing step S240 is repeated. By performing the cycle the predetermined number of times, it is possible to form the film on the substrate S.

When the cycle has been performed the predetermined number of times ("YES" in the step S250 of FIG. 8), the film-forming step S140 is terminated. As described above, it is possible to form the film on the substrate S with a predetermined thickness by performing the cycle the predetermined number of times (3) EFFECTS ACCORDING TO EMBODIMENTS According to the embodiments described above, it is possible to provide at least one or more of the following effects.

(a) It is possible to suppress the generation of the particles by removing the by-products on the substrate.

(b) By transferring the substrate S through the plurality of the regions of different pressures (different vacuum degrees), it is possible to remove the by-products in the groove of a high aspect ratio, and to suppress the generation of the particles.

(c) By increasing the moving distance of the substrate S in a low pressure (high vacuum) region of the purge region where the pressure is lower than other regions of the purge region (the vacuum degree is higher than other regions of the purge region), it is possible to more effectively remove the by-products on the substrate S.

(d) By setting the inner diameter of the exhaust pipe connected to the exhaust passage communicating with the low pressure (high vacuum) region of the purge region greater than the inner diameters of the exhaust pipes connected to the exhaust passages communicating with other regions of the purge region and by easily vacuum-exhausting the low pressure (high vacuum) region of the purge region, it is possible to easily discharge the by-products on the substrate S.

(e) By providing the auxiliary pump at the exhaust pipe connected to the exhaust passage communicating with the low pressure (high vacuum) region of the purge region and by easily vacuum-exhausting the low pressure (high vacuum) region of the purge region, it is possible to easily discharge the by-products on the substrate S as compared with a case where only a vacuum pump is provided.

(4) MODIFIED EXAMPLES

While the embodiments are described in detail, the above-described technique is not limited thereto. For example, features such as the shape of the ceiling constituting the purge regions 207a and 207b are not limited to the embodiments described above. For example, the features may be modified as in the following examples. Hereinafter, the following examples will be mainly described based on the differences between the embodiments and the following examples. According to the following examples, it is possible to obtain the same effects as those of the embodiments.

First Modified Example

Figure 9:
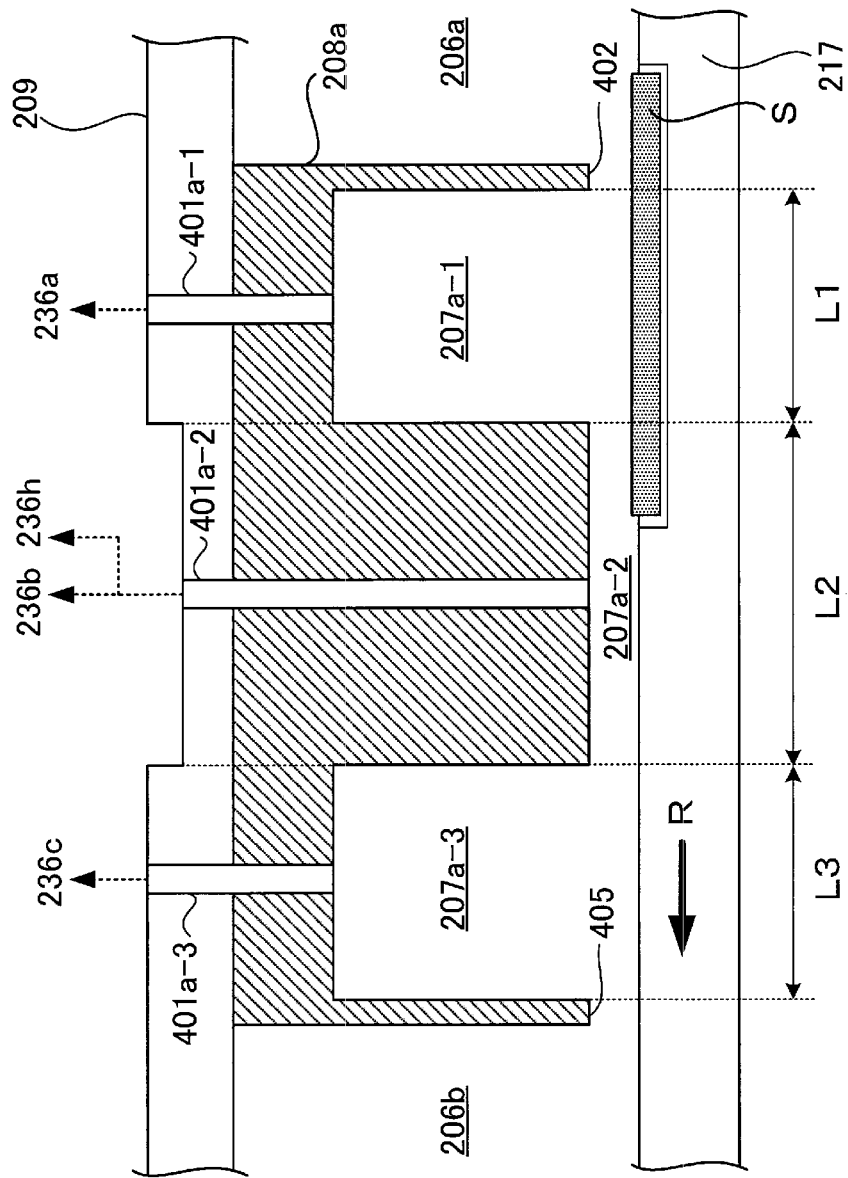
FIG. 9 schematically illustrates a modified example of a vertical cross-section taken along the line B-B' of the reactor of the substrate processing apparatus according to the embodiments shown in FIG. 1.

FIG. 9 schematically illustrates a modified example of a vertical cross-section taken along the line B-B' of the reactor 200 of the substrate processing apparatus shown in FIG. 1. According to a first modified example shown in FIG. 9, the second region is different from the second region of each of the purge regions 207a and 207b. The first modified example will be described based on the purge region 207a.

According to the first modified example, the partition 403 configured to separate the first region 207a-1 and the second region 207a-2 according to the embodiments and the partition 404 configured to separate the second region 207a-2 and the third region 207a-3 according to the embodiments are not provided. For example, according to the first modified example, the height of the ceiling 208a corresponding to the second region 207a-2 is equal to the lower end of the partition 403 and the lower end of the partition 404. In addition, for example, according to the first modified example, the height of an upper surface of the top plate 209 in the second region 207a-2 (that is, the distance from the upper surface of the rotary table 217 to the upper surface of the top plate 209 in the second region 207a-2) is lower than the height of the upper surface of the top plate 209 in the first region 207a-1 (that is, the distance from the upper surface of the rotary table 217 to the upper surface of the top plate 209 in the first region 207a-1) and the height of the upper surface of the top plate 209 in the third region 207a-3 (that is, the distance from the upper surface of the rotary table 217 to the upper surface of the top plate 209 in the third region 207a-3).

As described above, by lowering the height of the upper surface of the top plate 209 in the second region 207a-2 as compared with the heights of the upper surfaces of the top plate 209 in other regions, it is possible to shorten the length of the exhaust passage 401a-2 communicating with the second region 207a-2 such that the second region 207a-2 is easily vacuum-exhausted. That is, by shortening the length of the exhaust passage communicating with the low pressure (high vacuum) region of the purge region and by easily vacuum-exhausting the low pressure (high vacuum) region of the purge region, it is possible to easily discharge the by-products on the substrate S.

Second Modified Example

FIG. 10 schematically illustrates another modified example of a vertical cross-section taken along the line B-B' of the reactor 200 of the substrate processing apparatus shown in FIG. 1. According to a second modified example shown in FIG. 10, the purge regions 207a and 207b are divided into four regions, respectively. The second modified example will be described based on the purge region 207a.

According to the second modified example, the purge region 207a is divided into four regions, that is, a first region 407a-1, a second region 407a-2, a third region 407a-3 and a fourth region 407a-4 in this order, from the rotationally upstream side to the rotationally downstream side along the rotation direction "R" of the rotary table 217 (also referred to as the transfer direction of the substrate S). According to the second modified example, the third region 407a-3 is to be purged at a first pressure. The second region 407a-2 and the fourth region 407a-4 are to be purged at a second pressure higher than the first pressure. The first region 407a-1 is to be purged at a third pressure.

A partition 502 configured to separate the first process region 206a and the first region 407a-1 is provided between the first process region 206a and the first region 407a-1. A partition 503 configured to separate the first region 407a-1 and the second region 407a-2 is provided between the first region 407a-1 and the second region 407a-2. A partition 504 configured to separate the second region 407a-2 and the third region 407a-3 is provided between the second region 407a-2 and the third region 407a-3. A partition 505 configured to separate the third region 407a-3 and the fourth region 407a-4 is provided between the third region 407a-3 and the fourth region 407a-4. A partition 506 configured to separate the fourth region 407a-4 and the second process region 206b is provided between the fourth region 407a-4 and the second process region 206b. Each of the partitions 502 through 506 serves as a part of the ceiling 208a. Each of the partitions 502 through 506 serves as a part of the ceiling 208a. The partitions 502 through 506 are connected continuously with the ceiling 208a.

Exhaust passages 507a-1, 507a-2, 507a-3 and 507a-4 communicating with the first region 407a-1, the second region 407a-2, the third region 407a-3 and the fourth region 407a-4, respectively, are provided in the ceiling 208a and the top plate 209. The exhaust passages 507a-1, 507a-2, 507a-3 and 507a-4 are connected to a vacuum pump (or vacuum pumps) via exhaust pipes, respectively. The first region 407a-1, the second region 407a-2, the third region 407a-3 and the fourth region 407a-4 may be exhausted such that an inner pressure of each of the first region 407a-1, the second region 407a-2, the third region 407a-3 and the fourth region 407a-4 reaches a predetermined pressure (vacuum degree).

Supply passages 501a-1, 501a-2 and 501a-3 communicating with the first region 407a-1, the second region 407a-2 and the fourth region 407a-4, respectively, are provided in the ceiling 208a and the top plate 209. A purge gas supplier (which is a purge gas supply system) (not shown) configured to supply the purge gas is connected to each of the supply passages 501a-1, 501a-2 and 501a-3 via valves (not shown). For example, the purge gas supplier is fixed to the ceiling 208a. According to the second modified example, an inert gas such as the $N_2$ gas is used as the purge gas.

According to the second modified example, two regions (that is, the second region 407a-2 where the pressure is higher than that of the third region 407a-3 and the first region 407a-1 where the pressure is higher than that of the second region 407a-2) are provided at a rotationally upstream side of the third region 407a-3 along the transfer direction of the substrate S. The third region 407a-3 serves as the low pressure (high vacuum) region of the purge region 207a. The height of the ceiling 208a corresponding to the first region 407a-1 is equal to the height of the ceiling 208a corresponding to the second region 407a-2. However, since the first region 407a-1 is adjacent to the first process region 206a, an inner pressure of the second region 407a-2 is lower than an inner pressure of the first region 407a-1. That is, the inner pressure of the first region 407a-1 is lower than the inner pressure of the first process region 206a, and higher than the inner pressure of the second region 407a-2.

According to the second modified example, the first region 407a-1, the second region 407a-2 and the fourth region 407a-4 are vacuum-exhausted while supplying the purge gas into each of the first region 407a-1, the second region 407a-2 and the fourth region 407a-4. Therefore, the $N_2$ gas flows at high speed in the space between the partition 503 and the rotary table 217. That is, a high flow velocity region is provided by partitioning a high pressure region and a low pressure region. Then, it is possible to discharge gas molecules in the groove of a high aspect ratio on the substrate S by a high speed flow of the N2 gas below the partition 503.

The controller 300 controls one or both of an exhaust amount in the second region 407a-2 and the first region 407a-1 and a supply flow rate (supply amount) of the purge gas by the purge gas supplier such that the inner pressure of the first region 407a-1 is lower than the inner pressure of the first process region 206a and higher than the inner pressure of the second region 407a-2. As a result, it is possible to form a high speed flow of the $N_2$ gas below the partition 503, and to discharge the gas molecules in the groove on the substrate S, particularly, the groove of a high aspect ratio. That is, in the purge regions 207a and 207b, by transferring the substrate S through a plurality of regions of different pressures (different vacuum degrees) while supplying the purge gas, it is possible to remove the by-products in the groove of a high aspect ratio.

While the technique is described in detail by way of the above-described embodiments and the modified examples, the above-described technique is not limited thereto. The above-described technique may be modified in various ways without departing from the gist thereof.

The embodiments of the technique are described based on the film-forming step serving as a part of manufacturing processes of a semiconductor device. However, the technique may be applied to other processes. For example, the technique may be applied to a step of performing a heat treatment process or a plasma treatment process on the substrate for each cycle. By applying the technique, it is possible to efficiently remove the by-products generated in the groove and the gas (molecules) desorbed from the film already formed on the substrate. In addition, the technique is not limited to the processes described above. For example, the technique may be applied to a process of etching each atomic layer (molecular layer) of the film formed on the substrate. By purging an etching gas as described above, it is possible to efficiently remove substances such as the by-products in the groove generated by etching and the etching gas present in the groove.

Preferred Embodiments of Technique

Preferred embodiments of the technique will be supplementarily described below.
Supplementary Note 1
According to one aspect of the technique described herein, there is provided a substrate processing apparatus including: a substrate processing apparatus including:
a process chamber in which a substrate is processed; and
a substrate support provided in the process chamber and including a plurality of supports where the substrate is placed,
wherein the process chamber includes a process region where a process gas is supplied to the substrate and a purge region where the process gas above the substrate is purged, and
the purge region includes a first pressure purge region to be purged at a first pressure and a second pressure purge region to be purged at a second pressure lower than the first pressure.

Supplementary Note 2

The substrate processing apparatus of Supplementary note 1, wherein a ceiling facing the substrate, and a partition connected continuously with the ceiling and configured to separate the first pressure purge region from the second pressure purge region are provided in the purge region, and a height of the ceiling corresponding to the second pressure purge region is lower than a height of the ceiling corresponding to the first pressure purge region, and is equal to or higher than a lower end of the partition.

Supplementary Note 3

The substrate processing apparatus of Supplementary note 1 or Supplementary note 2, wherein a diameter of an exhaust pipe connected to the second pressure purge region is greater than that of an exhaust pipe connected to the first pressure purge region.

Supplementary Note 4

The substrate processing apparatus of Supplementary note 2, wherein the ceiling is constituted by a lower surface of a top plate constituting the process chamber, and a height of an upper surface of the top plate in the second pressure purge region is lower than a height of the upper surface of the top plate in the first pressure purge region.

Supplementary Note 5

The substrate processing apparatus of any one of Supplementary notes 1 through 4, wherein an inner pressure of the first pressure purge region is lower than an inner pressure of the process region.

Supplementary Note 6

The substrate processing apparatus of any one of Supplementary notes 1 through 5, wherein a moving distance of the substrate in the second pressure purge region is longer than a moving distance of the substrate in the first pressure purge region.

Supplementary Note 7

The substrate processing apparatus of any one of Supplementary notes 1 through 6, wherein the purge region further includes a third pressure purge region to be purged at a third pressure, the substrate processing apparatus further including:

a purge gas supplier configured to supply a purge gas to the first pressure purge region and the third pressure purge region; and a controller configured to control one or both of an exhaust amount in the first pressure purge region and the third pressure purge region and a supply flow rate of the purge gas by the purge gas supplier such that an inner pressure of the third pressure purge region is lower than an inner pressure of the process region and higher than an inner pressure of the second pressure purge region.

Supplementary Note 8

According to still another aspect of the technique described herein, there is provided a method of manufacturing a semiconductor device using a substrate processing apparatus including: a process chamber in which a substrate is processed; and a substrate support provided in the process chamber and including a plurality of supports where the substrate is placed, wherein the process chamber includes a process region where a process gas is supplied to the substrate, a first pressure purge region to be purged at a first pressure and a second pressure purge region to be purged at a second pressure higher than the first pressure, the method including:

(a) supplying the purge gas to the substrate;
(b) purging the substrate at the first pressure; and
(c) purging the substrate at the second pressure,
wherein (c) is performed before or after (b).

According to still another aspect of the technique described herein, there is provided a non-transitory computer-readable recording medium storing a program related to a substrate processing apparatus including: a process chamber in which a substrate is processed; and a substrate support provided in the process chamber and including: a plurality of supports where the substrate is placed, wherein the process chamber includes a process region where a process gas is supplied to the substrate, a first pressure purge region to be purged at a first pressure and a second pressure purge region to be purged at a second pressure higher than the first pressure, wherein the program causes, by a computer, the substrate processing apparatus to perform:

(a) supplying the purge gas to the substrate;
(b) purging the substrate at the first pressure; and
(c) purging the substrate at the second pressure,
wherein (c) is performed before or after (b).

According to some embodiments in the present disclosure, it is possible to suppress the generation of the particles by removing the by-products.

What is claimed is:

1. A substrate processing apparatus comprising:
a process chamber in which a substrate is processed; and
a substrate support provided in the process chamber and comprising a plurality of supports where the substrate is placed,
wherein the process chamber comprises a process region where a process gas is supplied to the substrate and a purge region where the process gas above the substrate is purged, and
the purge region comprises:
a first region to be exhausted at a first pressure, wherein an exhaust pump is connected thereto;
a second region to be exhausted at a second pressure lower than the first pressure, wherein the exhaust pump is connected thereto;
a ceiling facing the substrate support and comprising a first ceiling portion disposed in the first region and a second ceiling portion formed as a single body with the first ceiling portion and disposed in the second region; and
a partition formed as a single body with both the first ceiling portion and the second ceiling portion and extending in a direction toward the substrate support from a boundary between the first ceiling portion and the second ceiling portion to a height lower than both of a height of the first ceiling portion and a height of the second ceiling portion.

2. The substrate processing apparatus of claim 1, wherein the partition is connected continuously with the ceiling and configured to separate the first region and the second region from each other, and the height of the second ceiling portion is lower than the height of the first ceiling portion.

3. The substrate processing apparatus of claim 1, wherein a diameter of an exhaust pipe connected to the second region is greater than that of an exhaust pipe connected to the first region.

4. The substrate processing apparatus of claim 2, wherein a diameter of an exhaust pipe connected to the second region is greater than that of an exhaust pipe connected to the first region.

5. The substrate processing apparatus of claim 2, wherein the ceiling is constituted by a lower surface of a top plate constituting the process chamber, and a vertical distance from the lower surface to an upper surface of the top plate in the second region is greater than a vertical distance from the lower surface to the upper surface of the top plate in the first region.

6. The substrate processing apparatus of claim 1, wherein a moving distance of the substrate in the second region is longer than a moving distance of the substrate in the first region.

7. The substrate processing apparatus of claim 2, wherein a moving distance of the substrate in the second region is longer than a moving distance of the substrate in the first region.

8. The substrate processing apparatus of claim 3, wherein a moving distance of the substrate in the second region is longer than a moving distance of the substrate in the first region.

9. The substrate processing apparatus of claim 4, wherein a moving distance of the substrate in the second region is longer than a moving distance of the substrate in the first region.

10. The substrate processing apparatus of claim 5, wherein a moving distance of the substrate in the second region is longer than a moving distance of the substrate in the first region.

11. The substrate processing apparatus of claim 1, wherein the purge region further comprises a third region to be purged at a third pressure, the substrate processing apparatus further comprising:
  a purge gas supplier configured to supply a purge gas to the first region and the third region; and
  a controller configured to control one or both of an exhaust amount in the first region and the third region and a supply flow rate of the purge gas by the purge gas supplier such that an inner pressure of the third region is lower than an inner pressure of the process region and higher than an inner pressure of the second region.

12. The substrate processing apparatus of claim 2, wherein the purge region further comprises a third region to be purged at a third pressure, the substrate processing apparatus further comprising:
  a purge gas supplier configured to supply a purge gas to the first region and the third region; and
  a controller configured to control one or both of an exhaust amount in the first region and the third region and a supply flow rate of the purge gas by the purge gas supplier such that an inner pressure of the third region is lower than an inner pressure of the process region and higher than an inner pressure of the second region.

13. The substrate processing apparatus of claim 3, wherein the purge region further comprises a third region to be purged at a third pressure, the substrate processing apparatus further comprising:
  a purge gas supplier configured to supply a purge gas to the first region and the third region; and
  a controller configured to control one or both of an exhaust amount in the first region and the third region and a supply flow rate of the purge gas by the purge gas supplier such that an inner pressure of the third region is lower than an inner pressure of the process region and higher than an inner pressure of the second region.

14. The substrate processing apparatus of claim 5, wherein the purge region further comprises a third region to be purged at a third pressure, the substrate processing apparatus further comprising:
  a purge gas supplier configured to supply a purge gas to the first region and the third region; and
  a controller configured to control one or both of an exhaust amount in the first region and the third region and a supply flow rate of the purge gas by the purge gas supplier such that an inner pressure of the third region is lower than an inner pressure of the process region and higher than an inner pressure of the second region.

15. The substrate processing apparatus of claim 6, wherein the purge region further comprises a third region to be purged at a third pressure, the substrate processing apparatus further comprising:
  a purge gas supplier configured to supply a purge gas to the first region and the third region; and
  a controller configured to control one or both of an exhaust amount in the first region and the third region and a supply flow rate of the purge gas by the purge gas supplier such that an inner pressure of the third region is lower than an inner pressure of the process region and higher than an inner pressure of the second region.

16. The substrate processing apparatus of claim 1, wherein an inner pressure of the first region is lower than an inner pressure of the process region.

17. The substrate processing apparatus of claim 2, wherein an inner pressure of the first region is lower than an inner pressure of the process region.

18. The substrate processing apparatus of claim 3, wherein an inner pressure of the first region is lower than an inner pressure of the process region.

19. The substrate processing apparatus of claim 4, wherein an inner pressure of the first region is lower than an inner pressure of the process region.

20. The substrate processing apparatus of claim 5, wherein an inner pressure of the first region is lower than an inner pressure of the process region.

* * * * *